US009548395B2

(12) United States Patent
Yamazaki et al.

(10) Patent No.: US 9,548,395 B2
(45) Date of Patent: Jan. 17, 2017

(54) FIELD-EFFECT TRANSISTOR INCLUDING OXIDE SEMICONDUCTOR, AND MEMORY AND SEMICONDUCTOR CIRCUIT INCLUDING THE SAME

(71) Applicant: Semiconductor Energy Laboratory Co., Ltd., Atsugi-shi, Kanagawa-ken (JP)

(72) Inventors: Shunpei Yamazaki, Tokyo (JP); Hiromichi Godo, Kanagawa (JP); Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/848,515

(22) Filed: Sep. 9, 2015

(65) Prior Publication Data
US 2015/0380417 A1 Dec. 31, 2015

Related U.S. Application Data

(63) Continuation of application No. 14/287,318, filed on May 27, 2014, now Pat. No. 9,287,408, which is a (Continued)

(30) Foreign Application Priority Data

Mar. 25, 2011 (JP) .................................. 2011-067213

(51) Int. Cl.
*H01L 29/12* (2006.01)
*H01L 29/786* (2006.01)
(Continued)

(52) U.S. Cl.
CPC ....... *H01L 29/7869* (2013.01); *H01L 27/0688* (2013.01); *H01L 27/108* (2013.01);
(Continued)

(58) Field of Classification Search
CPC ................................................ H01L 27/0688
(Continued)

(56) References Cited

U.S. PATENT DOCUMENTS 4,902,638 A  2/1990 Muto
4,907,861 A  3/1990 Muto
(Continued)

FOREIGN PATENT DOCUMENTS

EP   0200138 A   12/1986
EP   1737044 A   12/2006
(Continued)

OTHER PUBLICATIONS

Taiwanese Office Action (Application No. 101109856) Dated Sep. 10, 2015.
(Continued)

*Primary Examiner* — Dung Le
(74) *Attorney, Agent, or Firm* — Fish & Richardson P.C.

(57) ABSTRACT

Provided is a field-effect transistor (FET) having small off-state current, which is used in a miniaturized semiconductor integrated circuit. The field-effect transistor includes a thin oxide semiconductor which is formed substantially perpendicular to an insulating surface, a gate insulating film formed to cover the oxide semiconductor, and a gate electrode which is formed to cover the gate insulating film. The gate electrode partly overlaps a source electrode and a drain electrode. The source electrode and the drain electrode are in contact with at least a top surface of the oxide semiconductor. In this structure, three surfaces of the thin oxide semiconductor are covered with the gate electrode, so that electrons injected from the source electrode or the drain electrode can be effectively removed, and most of the space between the source electrode and the drain electrode can be a depletion region; thus, off-state current can be reduced.

18 Claims, 13 Drawing Sheets

Related U.S. Application Data continuation of application No. 13/428,008, filed on Mar. 23, 2012, now Pat. No. 8,754,409.

(51) Int. Cl.

| | | |
|---|---|---|
| *H01L 27/06* | (2006.01) | |
| *H01L 29/78* | (2006.01) | |
| *H01L 27/108* | (2006.01) | |
| *H01L 27/115* | (2006.01) | |
| *H01L 27/12* | (2006.01) | |
| *H01L 49/02* | (2006.01) | |
| *H01L 29/417* | (2006.01) | |

(52) U.S. Cl.
CPC .. *H01L 27/10805* (2013.01); *H01L 27/10826* (2013.01); *H01L 27/10852* (2013.01); *H01L 27/10879* (2013.01); *H01L 27/10894* (2013.01); *H01L 27/10897* (2013.01); *H01L 27/1156* (2013.01); *H01L 27/1203* (2013.01); *H01L 27/1225* (2013.01); *H01L 28/90* (2013.01); *H01L 29/41733* (2013.01); *H01L 29/785* (2013.01); *H01L 29/78609* (2013.01)

(58) Field of Classification Search
USPC .................................................. 257/613–614
See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 * | 6/2006 | Hosono .................. C30B 23/02 257/15 |
| 7,064,346 | B2 | 6/2006 | Kawasaki et al. |
| 7,105,868 | B2 | 9/2006 | Nause et al. |
| 7,186,599 | B2 | 3/2007 | Ahmed et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,468,901 | B2 | 12/2008 | Kameshiro et al. |
| 7,501,293 | B2 | 3/2009 | Ito et al. |
| 7,622,773 | B2 | 11/2009 | Irisawa et al. |
| 7,674,650 | B2 | 3/2010 | Akimoto et al. |
| 7,732,819 | B2 | 6/2010 | Akimoto et al. |
| 7,742,351 | B2 | 6/2010 | Inoue et al. |
| 7,898,857 | B2 | 3/2011 | Kirsch et al. |
| 7,902,057 | B2 | 3/2011 | Mcdaniel |
| 8,004,045 | B2 | 8/2011 | Sasaki et al. |
| 8,063,437 | B2 | 11/2011 | Sasaki et al. |
| 8,089,117 | B2 | 1/2012 | Shimizu |
| 8,110,467 | B2 | 2/2012 | Chang et al. |
| 8,124,976 | B2 | 2/2012 | Takeda et al. |
| 8,149,619 | B2 | 4/2012 | Kirsch et al. |
| 8,164,152 | B2 | 4/2012 | Lee et al. |
| 8,202,365 | B2 | 6/2012 | Umeda et al. |
| 8,207,063 | B2 | 6/2012 | Cowdery-Corvan et al. |
| 8,207,531 | B2 | 6/2012 | Takahashi et al. |
| 8,373,237 | B2 | 2/2013 | Park et al. |
| 8,492,758 | B2 | 7/2013 | Yamazaki et al. |
| 8,536,000 | B2 | 9/2013 | Sasaki et al. |
| 8,729,627 | B2 | 5/2014 | Cheng et al. |
| 8,754,409 | B2 | 6/2014 | Yamazaki et al. |
| 8,878,298 | B2 | 11/2014 | Chang et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0093067 | A1 | 5/2005 | Yeo et al. |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0076625 | A1 | 4/2006 | Lee et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0227648 | A1 | 10/2006 | Kameshiro et al. |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0004224 | A1 | 1/2007 | Currie |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0072276 | A1 | 3/2009 | Inaba |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0206332 | A1 | 8/2009 | Son et al. |
| 2009/0242990 | A1 | 10/2009 | Saitoh et al. |
| 2009/0278122 | A1 | 11/2009 | Hosono et al. |
| 2009/0280600 | A1 | 11/2009 | Hosono et al. |

(56) References Cited

U.S. PATENT DOCUMENTS

| | | |
|---|---|---|
| 2010/0051935 A1 | 3/2010 | Lee et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0140608 A1 | 6/2010 | Park et al. |
| 2010/0270619 A1 | 10/2010 | Lee |
| 2011/0001136 A1 | 1/2011 | Hasegawa et al. |
| 2011/0049509 A1 | 3/2011 | Takahashi et al. |
| 2011/0053361 A1 | 3/2011 | Muralidhar et al. |
| 2011/0062436 A1 | 3/2011 | Yamazaki et al. |
| 2011/0101429 A1 | 5/2011 | Mcdaniel |
| 2011/0121288 A1 | 5/2011 | Yamazaki et al. |
| 2011/0127522 A1 | 6/2011 | Yamazaki |
| 2011/0148455 A1 | 6/2011 | Kato et al. |
| 2011/0156027 A1 | 6/2011 | Yamazaki et al. |
| 2011/0186932 A1 | 8/2011 | Mizumura et al. |
| 2012/0001266 A1 | 1/2012 | Lim et al. |
| 2012/0015504 A1 | 1/2012 | Sasaki et al. |
| 2012/0202330 A1 | 8/2012 | Takeda et al. |
| 2012/0205651 A1 | 8/2012 | Lee et al. |

FOREIGN PATENT DOCUMENTS

| | | |
|---|---|---|
| EP | 2175492 A | 4/2010 |
| EP | 2219225 A | 8/2010 |
| EP | 2226847 A | 9/2010 |
| JP | 60-198861 A | 10/1985 |
| JP | 61-245136 A | 10/1986 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-086595 A | 3/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-073663 A | 3/2007 |
| JP | 2007-220809 A | 8/2007 |
| JP | 2008-243927 A | 10/2008 |
| JP | 2009-167087 A | 7/2009 |
| JP | 2010-517292 | 5/2010 |
| JP | 2010-123913 A | 6/2010 |
| JP | 2010-177431 A | 8/2010 |
| JP | 2009/016778 | 10/2010 |
| JP | 2011-014753 A | 1/2011 |
| JP | 5521102 | 6/2014 |
| KR | 2006-0028575 A | 3/2006 |
| KR | 2006-0123480 A | 12/2006 |
| TW | 200818400 | 4/2008 |
| TW | 200921800 | 5/2009 |
| TW | 200939470 | 9/2009 |
| TW | 200945505 | 11/2009 |
| TW | 201110347 | 3/2011 |
| WO | WO-2004/114391 | 12/2004 |
| WO | WO-2005/071727 | 8/2005 |
| WO | WO-2007/063990 | 6/2007 |
| WO | WO-2008/091504 | 7/2008 |
| WO | WO-2009/018486 | 2/2009 |
| WO | WO-2009/117222 | 9/2009 |
| WO | WO-2010/123750 | 10/2010 |

OTHER PUBLICATIONS

Korean Office Action (Application No. 2014-0051785) Dated Oct. 14, 2015.

Taiwanese Office Action (Application No. 103117616) Dated Nov. 3, 2015.

Hisamoto.D et al., "A Folded-channel MOSFET for Deep-sub-tenth Micron Era", IEDM 98: Technical Digest of International Electron Devices Meeting, Dec. 6, 1998, pp. 1032-1034.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting Dec. 5, 2005, pp. 1067-1069.

Fortunato.E et al., "Wide-Bandgap High-Mobility ZNO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZNO TFTS) for AMLCDS", J. Soc. Inf. Display (Journal of The Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg—Silicon Technology", SID Digest '04 : SID International Symposium Digest of Technical Papers, 2004, vol. 35, pp. 860-863.

(56) References Cited

OTHER PUBLICATIONS

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS, Meeting, 2008, No. 2317, ECS.

Kimizuka.N. et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu, or Zn] at Temperatures Over 1000 ° C.", Journal of Solid State Chemistry, 1985, vol. 60, pp. 382-384.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuts, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physcial Review Letters), Jan. 26, 2006, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID Digest International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Sympoisum Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vaccuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

(56) References Cited

OTHER PUBLICATIONS

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIELD-EFFECT TRANSISTOR INCLUDING OXIDE SEMICONDUCTOR, AND MEMORY AND SEMICONDUCTOR CIRCUIT INCLUDING THE SAME

CROSS-REFERENCE TO RELATED APPLICATIONS

This application is a continuation of U.S. application Ser. No. 14/287,318, filed May 27, 2014, now U.S. Pat. No. 9,287,408, which is a continuation of U.S. application Ser. No. 13/428,008, filed Mar. 23, 2012, now U.S. Pat. No. 8,754,409, which claims the benefit of a foreign priority application filed in Japan as Serial No. 2011-067213 on Mar. 25, 2011, all of which are incorporated by reference.

BACKGROUND OF THE INVENTION

1. Field of the Invention

The present invention relates to a field-effect transistor and a semiconductor device including it.

2. Description of the Related Art

A field-effect transistor (hereinafter, FET) used for a semiconductor integrated circuit or the like has been conventionally formed using a semiconductor such as silicon (see Non-Patent Document 1, for example). In recent years, a field-effect transistor including an oxide semiconductor having a band gap of 2.5 eV or more is reported. In particular, it has been revealed that by extremely lowering the donor concentration in a semiconductor layer, off-state current can be lowered to a value which cannot be measured by an ordinal method (see Patent Document 1, for example).

For example, the off-state current per micrometer of the channel width is generally larger than or equal to $1 \times 10^{-15}$ A/µm in an FET including silicon, while the off-state current per micrometer of the channel width can be smaller than or equal to $1 \times 10^{-18}$ A/µm in an FET including an indium-gallium-zinc-based oxide (In—Ga—Zn-based oxide) semiconductor. This is because the concentration of thermally excited carriers in an intrinsic semiconductor is extremely low due to its large band gap. When the band gap is greater than or equal to 3 eV, the smallest off-state current is smaller than or equal to $1 \times 10^{-31}$ A/µm in theory.

When such an FET having extremely small off-state current is used in a dynamic random access memory including one FET and one capacitor (1T1C DRAM), the interval between refresh operations can be sufficiently longer. Ideally, data can be held semipermanently without a refresh operation (see Patent Document 2).

Further, when a gain cell memory including two transistors and one capacitor (see Patent Document 3) is formed using FETs each having an extremely small off-state current, a non-volatile memory which can hold data semipermanently can be provided. Although a gain cell memory, which has been proposed so far, does not need a capacitor with large capacity and has been regarded as an element to overcome disadvantages of the 1T1C DRAM, the off-state current of the gain cell memory cannot be sufficiently reduced in many cases, and thus, the gain cell memory has not been put into practical use.

REFERENCE

Patent Document

[Patent Document 1] United States Patent Application Publication No. 2011/0148455
[Patent Document 2] United States Patent Application Publication No. 2011/0156027
[Patent Document 3] U.S. Pat. No. 7,468,901

Non-Patent Document

[Non-Patent Document 1] Hisamoto et al., "A Folded-channel MOSFET for Deep-sub-tenth Micron Era", IEDM Tech. Dig., pp. 1032-1034, 1998.

SUMMARY OF THE INVENTION

However, the present inventors have found that such extremely small off-state current can be obtained when the channel length is long enough and that because of a short channel effect, the extremely small off-state current cannot be obtained when the channel length is shorter than or equal to 100 nm.

The reason for the above is described with reference to FIGS. 10A and 10B. FIG. 10A illustrates the case where the channel length is long enough. Electrons (carriers) are injected to an oxide semiconductor 201a in a film form from a source 204a and a drain 205a each of which forms an ohmic contact with the oxide semiconductor 201a. However, when the work function of a gate 203a is higher than or equal to 5.2 eV, the electrons are removed from the oxide semiconductor 201a and a depletion region 206a in which an electron does not exist can be formed in a wide region.

With the depletion region 206a, current can be prevented from flowing between the source 204a and the drain 205a; as a result, extremely small off-state current can be obtained. The thinner a gate insulating film 202a becomes and the higher a permittivity thereof becomes, the more effectively electrons can be removed. In addition, the higher the work function of the gate 203a becomes, the more effectively electrons can be removed.

FIG. 10B illustrates the case where the channel length of the oxide semiconductor is shortened while the thickness thereof remains the same as that in FIG. 10A. In this case, a gate does not affect particularly a lower portion of an oxide semiconductor 201b (a portion opposite to a gate insulating film 202b), and thus, the electron concentration cannot be sufficiently reduced. In other words, a depletion region 206b is formed on the gate 203b side in the oxide semiconductor 201b, while the depletion region 206b is not formed in the lower portion of the oxide semiconductor 201b. As a result, current flowing between a source 204b and a drain 205b cannot be sufficiently prevented.

In some cases, such a problem can be solved in such a manner that the oxide semiconductor 201b is made as thin as possible. However, when the thickness of the oxide semiconductor 201b is less than 1 nm, a problem with semiconductor characteristics of the oxide semiconductor 201b might occur. Particularly in the case where the oxide semiconductor 201b has a crystal structure, necessary crystallinity might not be obtained in some cases.

In an FET including silicon, an increase in off-state current and a degradation of the subthreshold characteristics due to short channel length are known as short channel effects. In an FET including an oxide semiconductor, such short channel effects become more severe. This is because it is hard to form a PN junction in an FET including an oxide semiconductor for dividing a channel formation region from a source or a drain, while a source and a channel formation region, or a drain and a channel formation region can be divided by a PN junction in an FET including silicon.

In general, for example, in the case where a source and a drain in an FET including silicon are high-concentration N-type regions, a channel formation region is a P-type region having an appropriate concentration. With a PN junction formed in this manner, electrons can be prevented from being injected to a channel from the source or the drain. When the concentration of the P-type impurity in the channel formation region is high, injection of electrons is more effectively prevented. Therefore, in the FET including silicon, when the channel length is short, a short channel effect can be suppressed by an increase of the impurity concentration of the channel formation region.

On the other hand, unlike in silicon, it is difficult in an oxide semiconductor to control a type (conductivity type) by doping. For example, an N-type semiconductor can be formed using an oxide containing indium, such as oxide indium, or an oxide containing zinc, such as zinc oxide, while a P-type semiconductor cannot be formed using such oxides. Therefore, unlike the FET including silicon, a method in which the channel formation region is a P-type region having a high concentration cannot be adopted.

In order to achieve miniaturization, it is necessary to shorten the channel length, and it is desired to obtain sufficiently small off-state current even with a short channel. An object of an embodiment of the present invention is to provide an FET in which an increase of off-state current due to a short channel can be prevented. Further, an object of an embodiment of the present invention is to provide a sufficiently miniaturized FET. Furthermore, an object of an embodiment of the present invention is to provide a semiconductor device including an FET. Moreover, an object of an embodiment of the present invention is to provide a method for manufacturing an FET or a semiconductor device. The present invention achieves at least one of the above objects.

An embodiment of the present invention is an FET including a thin oxide semiconductor formed substantially perpendicular to an insulating surface, a gate insulating film formed to cover the oxide semiconductor, and a strip-like gate formed to cover the gate insulating film. The thickness of the oxide semiconductor is greater than or equal to 1 nm and less than or equal to 30 nm, preferably greater than or equal to 3 nm and less than or equal to 5 nm, and the height thereof is greater than or equal to the minimum feature size. The width of the strip-like gate is greater than or equal to 10 nm and less than or equal to 100 nm, preferably greater than or equal to 10 nm and less than or equal to 30 nm. Note that the tem "substantially perpendicular" in this specification means the case where an angle formed with a surface of an object is larger than or equal to 70° and smaller than or equal to 110°.

An embodiment of the present invention is an FET including a thin oxide semiconductor formed substantially perpendicular to an insulating surface, a source and a drain each of which is in contact with at least three surfaces of the oxide semiconductor, and a gate insulating film formed to cover the oxide semiconductor. The thickness of the oxide semiconductor is greater than or equal to 1 nm and less than or equal to 30 nm, preferably greater than or equal to 3 nm and less than or equal to 5 nm, and the height thereof is greater than or equal to the minimum feature size. Here, the distance between the source and the drain is larger than or equal to 10 nm and less than or equal to 100 nm, preferably larger than or equal to 10 nm and less than or equal to 30 nm.

In the above, indium oxide, zinc oxide, or tin oxide can be used as the oxide semiconductor. Alternatively, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, an In—Sn-based oxide, or an In—Ga-based oxide can be used. Here, for example, an In—Ga-based oxide means an oxide containing 5 atomic % or more of each of indium (In) and gallium (Ga) and may contain another element.

For example, in the case where an In—Zn-based oxide is used, the oxide semiconductor can be formed using an oxide target containing indium (In) and zinc (Zn) at In/Zn=0.5 to 50, preferably In/Zn=1 to 20, more preferably In/Zn=1.5 to 15. Note that in a target used for formation of an In—Zn-based oxide which has an atomic ratio of In:Zn:O=x:y:z, the relation z>1.5x+y is preferably satisfied. When the proportion of indium is increased, the mobility of an FET can be increased.

Similarly, a three-component metal oxide such as an In—Ga—Zn-based oxide, an In—Sn—Zn-based oxide, an In—Al—Zn-based oxide, a Sn—Ga—Zn-based oxide, an Al—Ga—Zn-based oxide, or a Sn—Al—Zn-based oxide can be used as the oxide semiconductor. Further, a four-component metal oxide such as an In—Sn—Ga—Zn-based oxide may be used.

Here, for example, an In—Ga—Zn-based oxide means an oxide containing 3.3 atomic % or more of each of indium (In), gallium (Ga), and zinc (Zn) and may contain another element. Further, an In—Sn—Ga—Zn-based oxide means an oxide containing 2.5 atomic % or more of each of indium (In), tin (Sn), gallium (Ga), and zinc (Zn) and may contain another element.

Further, in the above, the oxide semiconductor may have a region having crystallinity. Furthermore, a c-axis of a crystal in the region is preferably substantially perpendicular to a surface of the oxide semiconductor. In particular, a region where a channel of the FET (a region over which a gate is formed or a region covered with the gate) preferably has crystallinity.

Such a crystal may have atoms arranged in a triangular, hexagonal, equilateral triangular, or regular hexagonal shape when seen from a direction perpendicular to an a-b plane, and have a phase in which metal atoms are arranged in layers in the c-axis direction or a phase in which metal atoms and oxygen atoms are arranged in layers in the c-axis direction. An oxide semiconductor including a crystal whose c-axis is substantially perpendicular to a surface is referred to as a c-axis aligned crystalline oxide semiconductor (CAAC-OS).

In the above, part of the oxide semiconductor may include a region containing nitrogen, boron, or phosphorus. In particular, such a region may be formed by a method such as an ion implantation method using a gate as a mask in a self-aligned manner. Further, the whole or part of the oxide semiconductor may contain a metal element which has a function of absorbing electrons, such as nickel or copper, or a metal element which has a function of forming a peroxide at 0.1 atomic % to 5 atomic %.

In the above, the gate insulating film may contain one or more materials selected from silicon oxide, tantalum oxide, hafnium oxide, aluminum oxide, yttrium oxide, lanthanum oxide, hafnium silicate, silicon oxynitride, and silicon nitride.

Further, in the above, the gate insulating film may be formed using an oxide in which 50 atomic % or more of a component other than oxygen is one or more elements selected from silicon, tantalum, hafnium, aluminum, yttrium, and lanthanum.

A metal element in this specification refers to all elements other than a rare gas element, hydrogen, boron, carbon, nitrogen, Group 16 elements (e.g., oxygen), Group 17 elements (e.g., fluorine), silicon, phosphorus, germanium, arsenic, and antimony. In addition, the term "oxide" means a compound the percentage of oxygen of which is 50 at. % or higher in elements other than a metal element included in the compound.

Another embodiment of the present invention is a memory including one or more of the above FETs. As the memory, a 1T1C RAM and a gain cell memory can be given. Another embodiment of the present invention is a semiconductor circuit which includes a register formed using the above FET, such as a central processing unit (CPU) or another semiconductor integrated circuit (e.g., LSI).

In any of the above structures, three surfaces of the thin oxide semiconductor are covered with the gate. Accordingly, electrons injected to the thin oxide semiconductor from the source or the drain can be effectively removed, and most of the region between the source and the drain can be a depletion region, resulting in a reduction in off-state current.

DETAILED DESCRIPTION OF THE INVENTION

Hereinafter, embodiments will be described with reference to the drawings. Note that the embodiments can be implemented with various modes, and it is easily understood by those skilled in the art that modes and details can be changed in various ways without departing from the spirit and scope of the present invention. Therefore, the present invention should not be interpreted as being limited to the following description of the embodiments.

Embodiment 1

Figure 1:
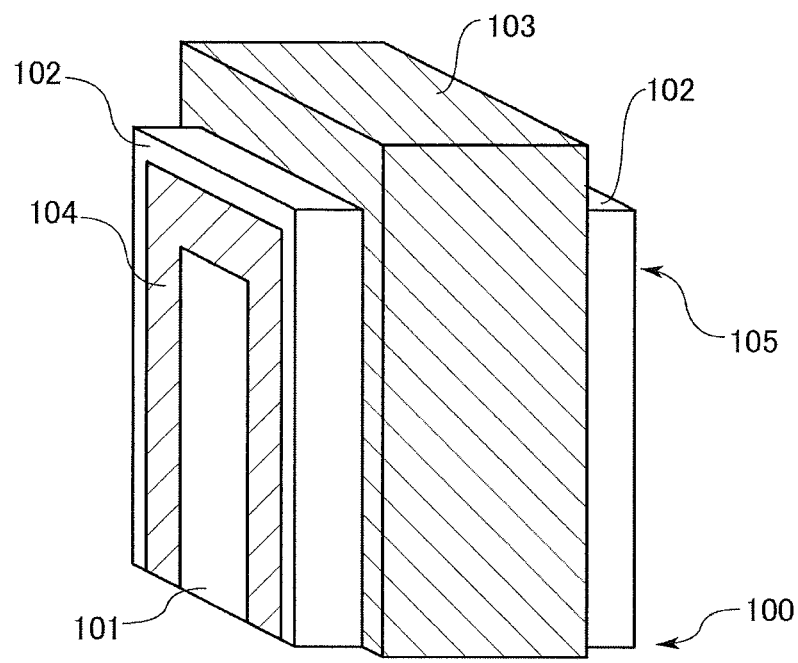
FIG. 1 illustrates an example of an FET according to an embodiment of the present invention.
Figure 2:
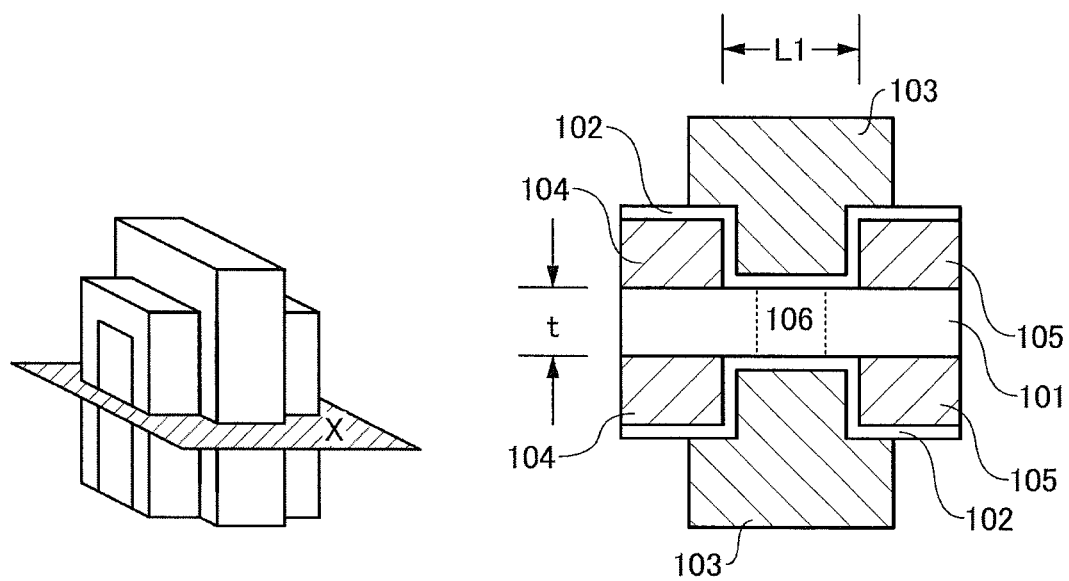
FIG. 2 illustrates an example of an FET according to an embodiment of the present invention.
Figure 3:
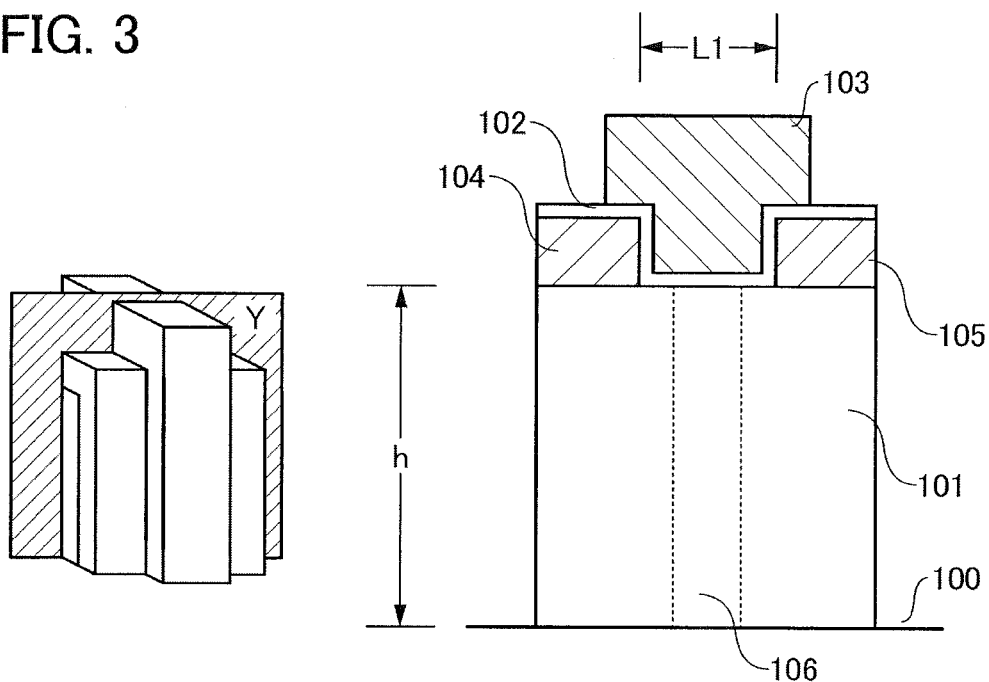
FIG. 3 illustrates an example of an FET according to an embodiment of the present invention.
Figure 4:
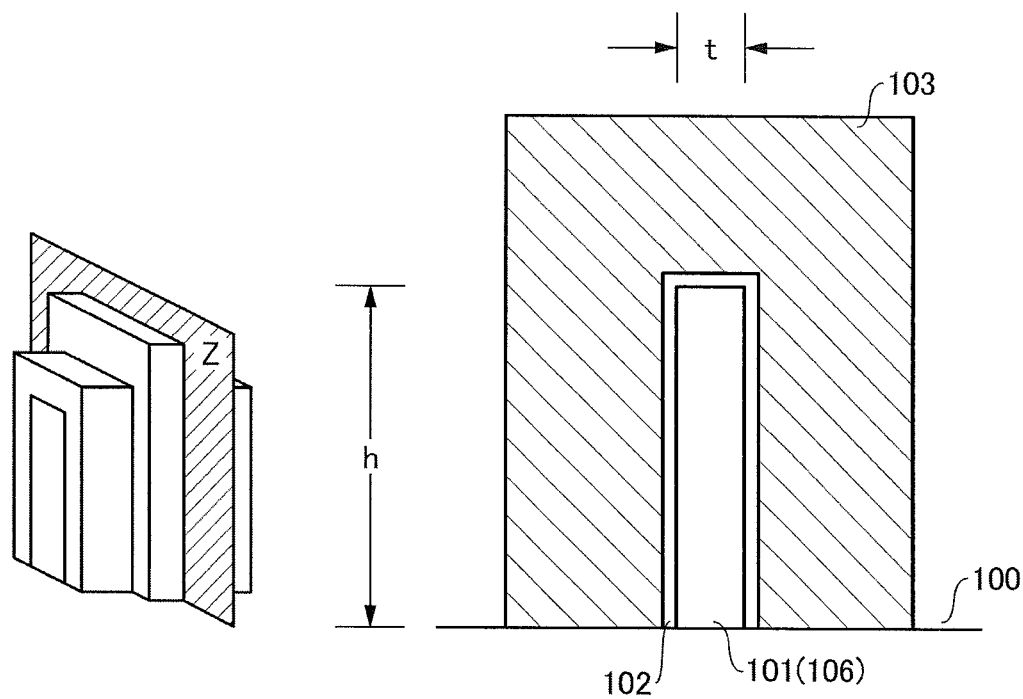
FIG. 4 illustrates an example of an FET according to an embodiment of the present invention.

FIG. 1, FIG. 2, FIG. 3, and FIG. 4 are conceptual views of shapes of an FET of this embodiment. FIG. 1 is a perspective view of the FET. FIG. 2 is a cross-sectional view of the FET cut by a plane X. FIG. 3 is a cross-sectional view of the FET cut by a plane Y. FIG. 4 is a cross-sectional view of the FET cut by a plane Z. The FET illustrated in FIG. 1, FIG. 2, FIG. 3, and FIG. 4 includes a thin oxide semiconductor 101 in contact with an insulating surface 100. A thickness t of the oxide semiconductor 101 is greater than or equal to 1 nm and less than or equal to 30 nm, preferably greater than or equal to 3 nm and less than or equal to 5 nm, and a height h of the oxide semiconductor 101 is greater than or equal to 5 nm and less than or equal to 100 nm, preferably greater than or equal to 10 nm and less than or equal to 50 nm.

The oxide semiconductor 101 preferably has a crystal structure, and preferably includes CAAC-OS described above. In this case, the oxide semiconductor 101 has a plurality of surfaces in addition to a bottom surface, and it is preferable that each of the surfaces include a plurality of crystals perpendicular to the surface. In order to obtain such a crystal state, heat treatment is preferably performed at appropriate temperature in an appropriate atmosphere after the thin amorphous oxide semiconductor is formed.

A source 104 and a drain 105 are provided in contact with part of the oxide semiconductor 101. For the source 104 and the drain 105, a layer of any of metal materials such as aluminum, magnesium, chromium, copper, tantalum, titanium, molybdenum, and tungsten, or an alloy material which contains any of the above metal materials as a main component can be used. As the layer of the alloy material, a layer of a Cu—Mg—Al alloy material can be used, for example. Alternatively, a nitride of any of the above metal materials may be used.

Further, the FET includes a gate insulating film 102 which covers the oxide semiconductor 101, the source 104, and the drain 105 and is provided in contact with the oxide semiconductor 101. The gate insulating film 102 may be formed using a single layer or a stack of two or more layers using one or more of materials selected from silicon oxide, tantalum oxide, hafnium oxide, aluminum oxide, yttrium oxide, lanthanum oxide, hafnium silicate, silicon oxynitride, and silicon nitride.

A gate 103 is formed to cover the gate insulating film 102. The gate 103 may be in contact with the gate insulating film 102, or the gate 103 is not necessarily in contact with the gate insulating film 102. Further, the gate 103 has a strip-like shape and is formed to overlap with part of the source 104 and part of the drain 105 in the FET of this embodiment. The channel length of this FET can be defined as L1 which is a distance between the source 104 and the drain 105 (see FIG. 2 and FIG. 3).

Further, the channel width can be defined as the sum of the length of three surfaces of the oxide semiconductor 101 (approximately 2 h+t) (see FIG. 4). Since h can be increased regardless of the minimum feature size of a circuit, the channel width can be sufficiently larger than the channel length. Therefore, on-state current of the FET can be increased.

The gate 103 may be formed using a single layer or a stack of two or more layers using one or more of platinum-based noble metals such as platinum, palladium, and osmium; metals such as tungsten, molybdenum, and titanium; nitrides of the metals; nitrides containing indium; oxynitrides containing indium; nitrides containing zinc; oxynitrides containing zinc; p-type silicon; and the like. In particular, it is preferable to provide a material having a work function of higher than or equal to 5.2 eV over the gate insulating film 102. For example, indium nitride is preferably used because it has a work function of 5.6 eV.

A material having a high work function generally has high resistivity. When such a material is used, the material having a high work function may be formed over the gate insulating film 102, and a material having conductivity higher than the material having a high work function may be provided thereover to have an appropriate thickness. There is no limitation on the work function of the material having higher conductivity.

As shown in FIG. 4, three surfaces of the oxide semiconductor 101 are covered with the gate 103. Therefore, electrons injected to the oxide semiconductor 101 from the source or the drain can be effectively removed and a depletion region 106 can be formed between the source and the drain; thus, off-state current can be reduced. Further, the channel width of the FET can be increased regardless of the area of the FET; accordingly, a semiconductor circuit capable of high-speed operation can be provided while integration degree of the semiconductor circuit is kept high.

Embodiment 2

Figure 5A:
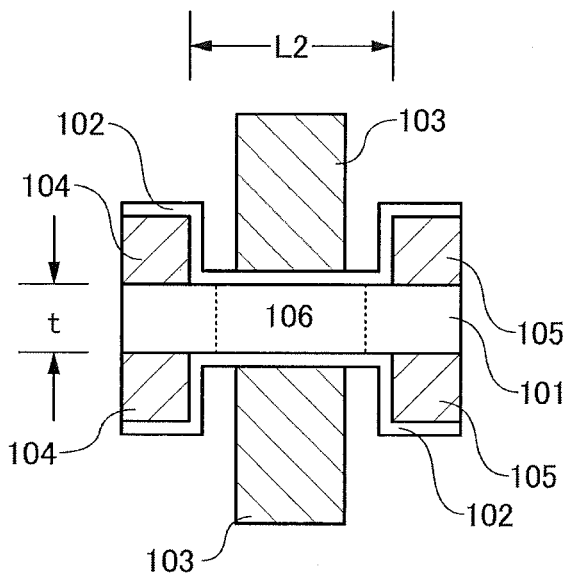
FIGS. 5A and 5B illustrate an example of an FET according to an embodiment of the present invention.
Figure 5B:
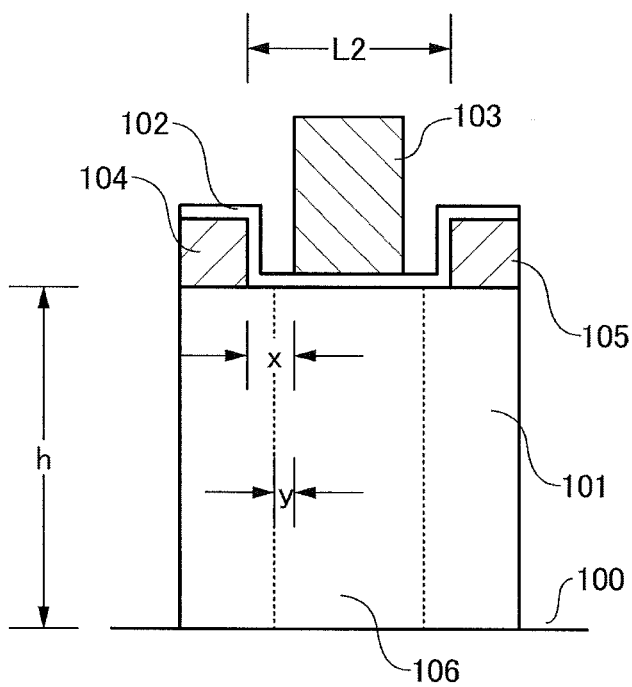

FIGS. 5A and 5B illustrate an FET of this embodiment. FIG. 5A is a cross-sectional view of the FET cut by a plane X, which corresponds to FIG. 2. FIG. 5B is a cross-sectional view of the FET cut by a plane Y, which corresponds to FIG. 3. Note that a cross-sectional view of the FET of this embodiment cut by a plane Z is the same as FIG. 4.

The FET of this embodiment includes the oxide semiconductor 101 which is in contact with the insulating surface 100. The source 104 and the drain 105 are provided in contact with part of the oxide semiconductor 101. Further, the FET includes the gate insulating film 102 which covers the oxide semiconductor 101, the source 104, and the drain 105 and is provided in contact with the oxide semiconductor 101. Furthermore, the gate 103 is provided to cover the gate insulating film 102. The FET of this embodiment is different from the FET of Embodiment 1 in that the gate 103 is provided so as not to overlap with either the source 104 or the drain 105.

In the FET illustrated in FIGS. 5A and 5B, the gate 103 does not overlap with either the source 104 or the drain 105; however, the gate 103 may overlap with only one of the source 104 and the drain 105. The channel length of the FET illustrated in FIGS. 5A and 5B is defined as L2 which is also the distance between the source 104 and the drain 105. The channel length includes portions where the gate 103 does not overlap with the source 104 and the gate 103 does not overlap with the drain 105 (offset regions). A width x of the offset region in FIG. 5B is preferably greater than or equal to 10 nm in terms of prevention of leakage current between the gate 103 and the source 104 and between the gate 103 and the drain 105.

In general, when an offset region is provided between a source and a drain, on-state current is decreased. However, a channel width W of the FET of this embodiment can be increased regardless of the minimum feature size of a circuit, as in the FET of Embodiment 1; therefore, on-state current of the FET is sufficiently large, which can offset a decrease of the on-state current due to the offset region.

Specifically, when the width x of the offset region is greater than or equal to 10 nm and less than or equal to 30 nm, preferably greater than or equal to 10 nm and less than or equal to 20 nm, a decrease in on-state current is very small. Further, when an offset region having the above size is provided, the depletion region 106 can expand, which can prevent short channel effects more effectively. Moreover, the parasitic capacitance between the gate 103 and the source 104 or between the gate 103 and the drain 105 can be reduced.

Note that even in the case where the FET having the above structure includes the thin gate insulating film, leakage current between the gate 103 and the source 104 or between the gate 103 and the drain 105 in an off state can be reduced. The leakage current in this case is caused mainly due to a tunneling effect, and is hereinafter referred to as tunneling current. As shown in FIGS. 5A and 5B, the area of the depletion region 106 expands to around the middle of a region between the gate 103 and the source 104 and to around the middle of a region between the gate 103 and the drain 105.

In this case, the tunneling current between the source 104 and the gate 103 needs to go over two barriers of the depletion region 106 and the gate insulating film 102, for example. The barrier height of the depletion region 106 on the basis of the source 104 is half the band gap of the oxide semiconductor 101 or more; for example, when the band gap of the oxide semiconductor is 3.2 eV, the barrier height is 1.6 eV.

This is smaller than the barrier height of silicon oxide (approximately 4 eV or smaller), which is a typical insulator; however, the long barrier is as effective as or more effective than the high barrier in reducing the tunneling current. Therefore, in the case where the depletion region 106 sufficiently expands and the barrier is long, the tunneling current can be sufficiently reduced.

For example, the FET of Embodiment 1 is not provided with an offset region; accordingly, the tunneling current between the source 104 and the gate 103 is determined in accordance with the thickness of the gate insulating film 102. Consequently, in order that the tunneling current is smaller than or equal to current flowing between the source and the drain, the physical thickness of the gate insulating film 102 needs to be greater than or equal to 5 nm. When the thickness of the gate insulating film 102 is less than 5 nm, the contribution of the tunneling current is increased, and thus, the off-state current including the tunneling current cannot be reduced.

In particular, since the area where the source 104 overlaps with the gate 103 is large in the FET of Embodiment 1, the physical thickness of the gate insulating film 102 practically needs to be greater than or equal to 10 nm. Thus, the thicker the gate insulating film 102 is, the smaller the on-state current (i.e., switching speed) of the FET becomes.

On the other hand, the FET of this embodiment only needs to satisfy either condition: (1) as illustrated in FIG. 5B, the sum of a distance y between an end of the depletion region 106 and an end portion of the gate 103 and the thickness of the gate insulating film 102 is larger than or equal to 5 nm;

or (2) the distance between the end of the depletion region 106 and the gate 103 is larger than or equal to 5 nm.

For example, when the distance y is 5 nm, the tunneling current between the source 104 and the gate 103 in an off state can be prevented even when the thickness of the gate insulating film 102 is 0. However, an FET cannot normally operate in an on state if the thickness of the gate insulating film 102 is 0. Therefore, the thickness of the gate insulating film 102 is practically greater than or equal to 0.5 nm and less than or equal to 5 nm, preferably greater than or equal to 0.5 nm and less than or equal to 2 nm.

The thickness of the gate insulating film 102 may be determined in consideration of the amount of the leakage current in an on state. The thick gate insulating film 102 is preferable in terms of suppression of power consumption, while the thin gate insulating film 102 is preferable in terms of high speed operation. For example, when the FET is used in a device, such as a memory, in which an on-state period is shorter than or equal to one ten-thousandth of an off-state period, power consumption is not remarkably increased even when the gate insulating film is made thin.

Embodiment 3

Figure 6A:
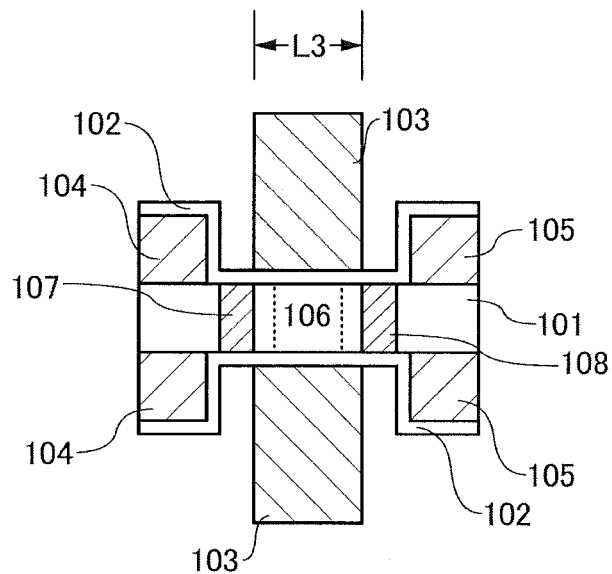
FIGS. 6A and 6B illustrate an example of an FET according to an embodiment of the present invention.
Figure 6B:
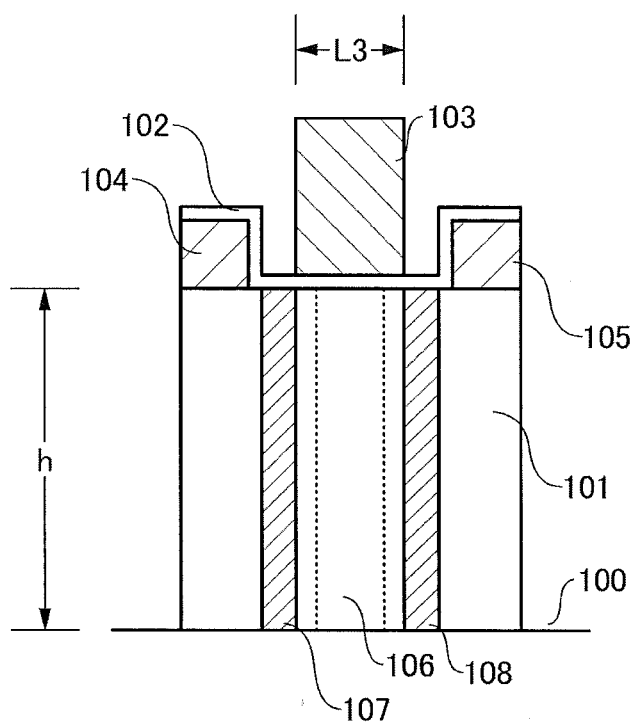

FIGS. 6A and 6B illustrate an FET of this embodiment. FIG. 6A is a cross-sectional view of the FET cut by a plane X, which corresponds to FIG. 2. FIG. 6B is a cross-sectional view of the FET cut by a plane Y, which corresponds to FIG. 3. Note that a cross-sectional view of the FET of this embodiment cut by a plane Z is the same as FIG. 4. The FET of this embodiment includes the oxide semiconductor 101 in contact with the insulating surface 100.

The source 104 and the drain 105 are provided in contact with part of the oxide semiconductor 101. The FET includes the gate insulating film 102 which covers the oxide semiconductor 101, the source 104, and the drain 105 and is provided in contact with the oxide semiconductor 101. Further, the gate 103 is formed to cover the gate insulating film 102. The gate 103 is provided so as not to overlap with either the source 104 or the drain 105, which is similar to the FET of Embodiment 2.

The FET of this embodiment is different from the FET of Embodiment 2 in that an N-type region 107 and an N-type region 108 are provided in the oxide semiconductor 101. The N-type region 107 and the N-type region 108 are formed in such a manner that nitrogen, boron, phosphorus, or the like is introduced into the oxide semiconductor 101 by an ion implantation method or the like with the use of the gate 103, the source 104, and the drain 105 as masks. The concentration of nitrogen, boron, or phosphorus in the N-type region 107 and the N-type region 108 is higher than or equal to $1 \times 10^{18}$ cm$^{-3}$ and lower than or equal to $1 \times 10^{22}$ cm$^{-3}$, preferably higher than or equal to $1 \times 10^{18}$ cm$^{-3}$ and lower than or equal to $1 \times 10^{20}$ cm$^{-3}$.

Although the FET illustrated in FIGS. 6A and 6B includes two N-type regions, only one N-type region may be provided. The channel length of the FET illustrated in FIGS. 6A and 6B can be practically defined as a gate width L3. The on-state current of the FET of this embodiment can be larger than that of the FET of Embodiment 2, and the parasitic capacitance between the gate 103 and the source 104 or between the gate 103 and the drain 105 in the FET of this embodiment can be reduced as compared to that in the FET of Embodiment 1.

Embodiment 4

Figure 7A:
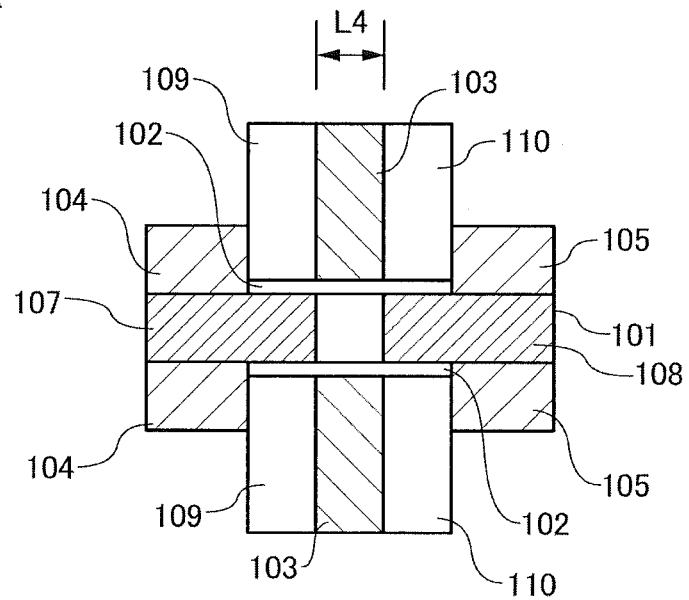
FIGS. 7A and 7B illustrate an example of an FET according to an embodiment of the present invention.
Figure 7B:
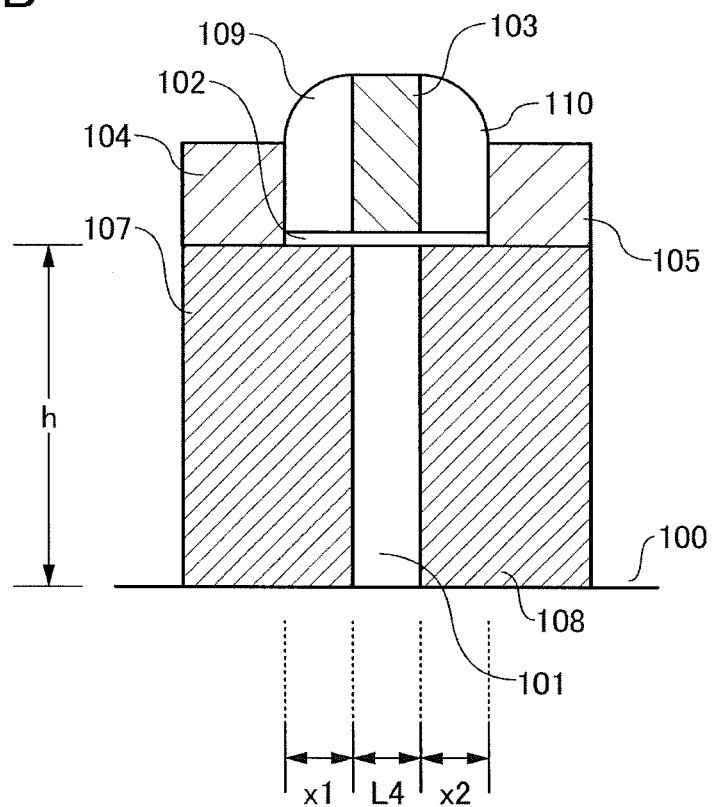

FIGS. 7A and 7B illustrate an FET of this embodiment. FIG. 7A is a cross-sectional view of the FET cut by a plane X, which corresponds to FIG. 2. FIG. 7B is a cross-sectional view of the FET cut by a plane Y, which corresponds to FIG. 3. Note that a cross-sectional view of the FET of this embodiment cut by a plane Z is the same as FIG. 4. The FET of this embodiment includes the oxide semiconductor 101 in contact with the insulating surface 100.

The source 104 and the drain 105 are provided in contact with part of the oxide semiconductor 101. The FET includes the gate insulating film 102 which covers part of the oxide semiconductor 101. An end portion of the gate insulating film 102 may be in contact with the source 104 or the drain 105.

Further, the gate 103 is formed to cover the gate insulating film 102. A sidewall insulator 109 and a sidewall insulator 110 are provided in contact with end portions of the gate 103. The sidewall insulator 109 is provided in contact with the source 104 and the sidewall insulator 110 is provided in contact with the drain 105. The sidewall insulator 109 and the sidewall insulator 110 prevent the source 104 and the drain 105 from being in contact with the gate 103, respectively.

The FET of this embodiment includes the N-type region 107 and the N-type region 108 in the oxide semiconductor 101. The N-type region 107 and the N-type region 108 are formed in such a manner that nitrogen, boron, phosphorus, or the like is introduced into the oxide semiconductor 101 by an ion implantation method or the like with the use of the gate 103 as a mask. The concentration of nitrogen, boron, or phosphorus in the N-type region 107 and the N-type region 108 is higher than or equal to $1 \times 10^{18}$ cm$^{-3}$ and lower than or equal to $1 \times 10^{22}$ cm$^{-3}$, preferably higher than or equal to $1 \times 10^{18}$ cm$^{-3}$ and lower than or equal to $1 \times 10^{20}$ cm$^{-3}$.

The channel length of the FET illustrated in FIGS. 7A and 7B can be practically defined as a gate width L4. Since portions of the oxide semiconductor 101 which overlap with the source 104 and the drain 105 are the N-type region 107 and the N-type region 108, the on-state current of the FET of this embodiment can be larger than the on-state current of the FET of Embodiment 3, and the parasitic capacitance between the gate 103 and the source 104 or between the gate 103 and the drain 105 in the FET of this embodiment can be reduced as compared to that in the FET of Embodiment 1.

Figure 10A:
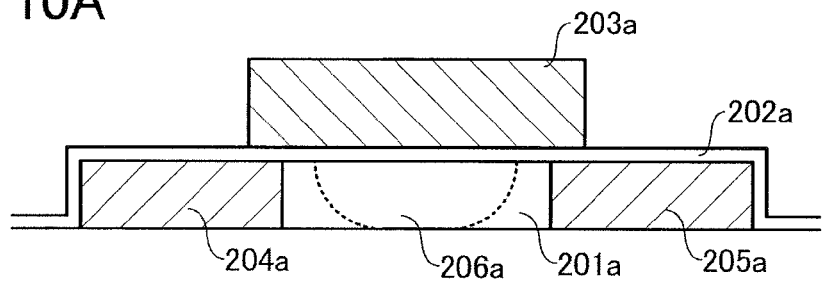
FIGS. 10A to 10C illustrates examples of conventional FETs.
Figure 10B:
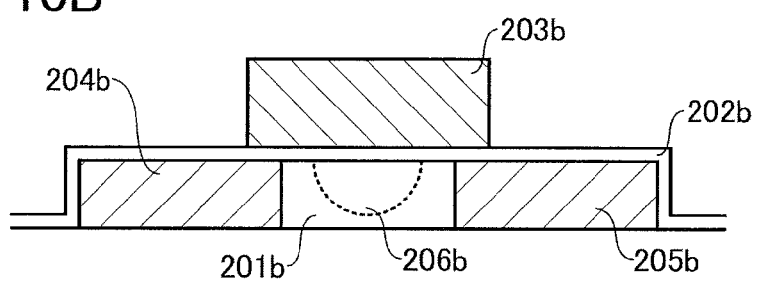
Figure 10C:
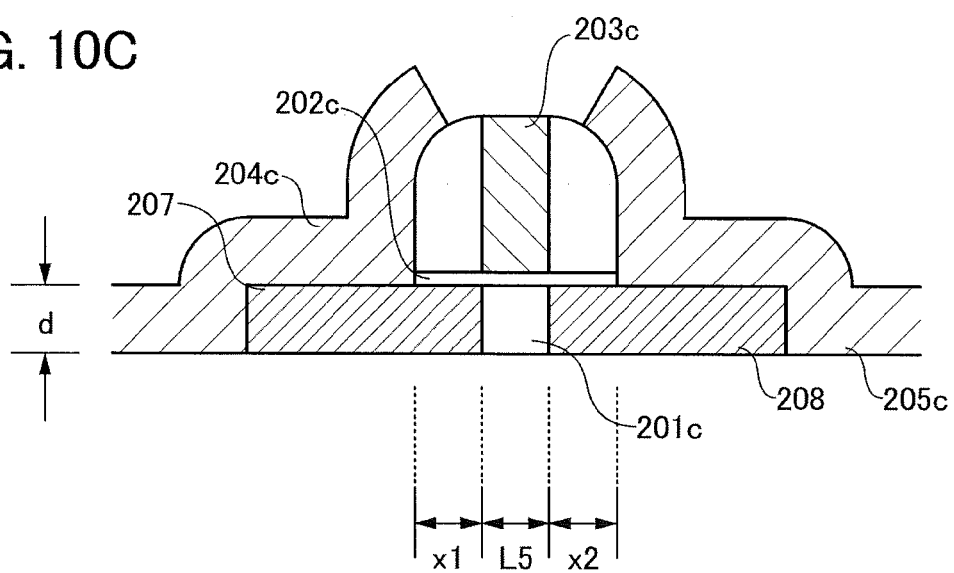

Calculation results of characteristics (the gate potential ($V_G$) dependence of drain current (ID)) of the FET illustrated in FIGS. 7A and 7B and a planar FET illustrated in FIG. 10C are shown below. Here, in the FET illustrated in FIGS. 7A and 7B, L4=t=x1=x2=30 nm, and h=50 nm. In other words, the channel length of the FET illustrated in FIGS. 7A and 7B is 30 nm and the channel width thereof is 130 nm. In the FET illustrated in FIG. 10C, L5=x1=x2=30 nm, a thickness d of an oxide semiconductor 201c is 30 nm, and the channel width thereof is 130 nm.

Further, in the FET illustrated in FIGS. 7A and 7B and the FET illustrated in FIG. 10C, the relative permittivity of the gate insulating film 102 and that of a gate insulating film 202c are 4.1; the thickness of the gate insulating film 102 and that of the gate insulating film 202c are 5 nm; the work function of the gate 103 and that of a gate 203c are 5.5 eV; the band gap of the oxide semiconductor 101 and that of the oxide semiconductor 201c are 3.15 eV; the electron affinity of the oxide semiconductor 101 and that of the oxide semiconductor 201c are 4.6 eV; the relative permittivity of the oxide semiconductor 101 and that of the oxide semiconductor 201c are 15; the resistivity of the N-type region 107 and the N-type region 108 and that of an N-type region 207 and an N-type region 208 are 0.3 Ω·cm; and the work function of the source 104 and the drain 105 and that of a source 204c and a drain 205c are 4.6 eV.

Figure 13A:
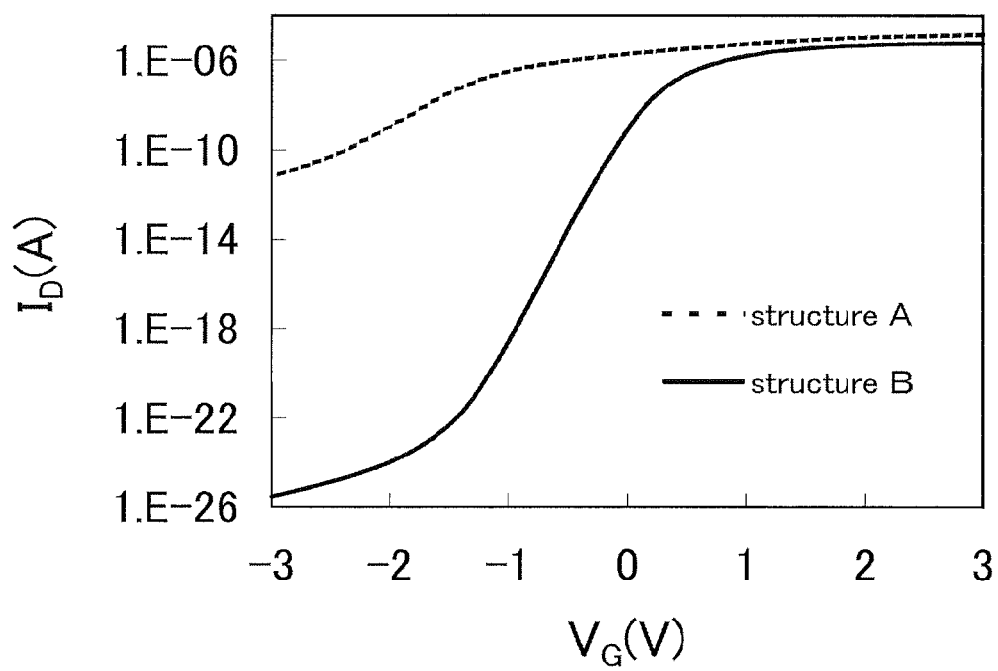
FIGS. 13A and 13B are graphs for comparing characteristics between an FET according to an embodiment of the present invention and a conventional FET.

For the calculation, device simulation software Sentaurus Device manufactured by Synopsys, Inc. is used. FIG. 13A shows the calculation result. Note that the potential of the source is 0 V and the potential of the drain is +1 V. In FIG. 13A, a structure A is a structure of the FET illustrated in FIG. 10C and a structure B is a structure of the FET illustrated in FIGS. 7A and 7B.

As shown in FIG. 13A, in particular, the off-state current of the FET having the structure A cannot be reduced, and the drain current is larger than or equal to $10^{-14}$ A even when the potential of the gate is −3 V. In contrast, in the FET having the structure B, the drain current is smaller than or equal to $10^{-18}$ A when the potential of the gate is −1 V, which means that the off-state current can be sufficiently reduced.

Figure 13B:
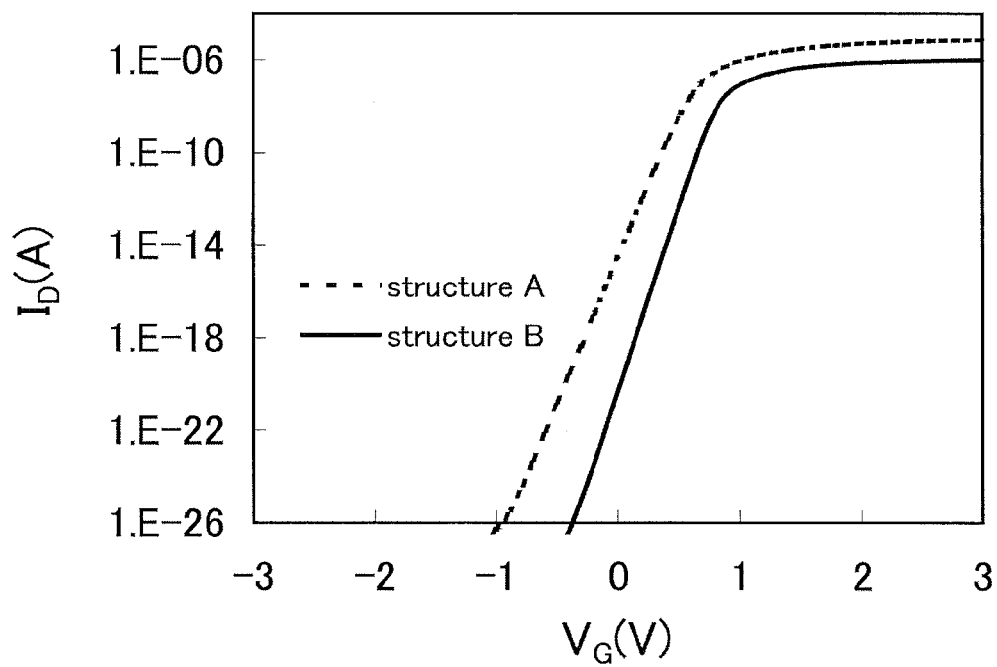

The same calculation is performed on FETs having the different sizes from the above. In the FET illustrated in FIGS. 7A and 7B, L4=x1=x2=30 nm, t=5 nm, and h=15 nm. In other words, the channel length of the FET illustrated in FIGS. 7A and 7B is 30 nm and the channel width thereof is 35 nm. In the FET illustrated in FIG. 10C, L5=x1=x2=30 nm, d=5 nm, and the channel width is 35 nm. FIG. 13B shows the calculation result. Note that the potential of the source is 0 V and the potential of the drain is +1 V.

In FIG. 13B, a structure A is a structure of the FET illustrated in FIG. 10C and a structure B is a structure of the FET illustrated in FIGS. 7A and 7B. Since the thickness of the oxide semiconductor 201c is reduced (with respect to the channel length), the off-state current of the FET having the structure A is slightly reduced; however, the off-state current thereof is still larger than the off-state current of the FET having the structure B. For example, in the case where the potential of the gate is 0 V, the drain current of the FET having the structure B is smaller than or equal to $10^{-20}$ A, while the drain current of the FET having the structure A is approximately $10^{-18}$ A.

The ratio of the channel length to the thickness t of the oxide semiconductor 101 or the oxide semiconductor 201c (L/t) is 1 in FIG. 13A while it is 6 in FIG. 13B. The FET having the structure A shows relatively favorable characteristics as shown in FIG. 13B because the oxide semiconductor 201c becomes thinner while the channel length remains the same, resulting in relief of a short channel effect.

In the FET having the structure B, such a relative reduction in the thickness of the oxide semiconductor 101 can relieve a short channel effect. In addition, the FET having the structure B shows characteristics good enough as an FET even at L/t of 2 or less at which a planar FET would not show good characteristics.

Embodiment 5

A method for manufacturing an FET of this embodiment will be described with reference to FIGS. 8A and 8B and FIGS. 9A and 9B. In each of FIGS. 8A and 8B and FIGS. 9A and 9B, three cross sections in each of the steps of manufacturing an FET are illustrated, as in FIG. 1 of Non-Patent Document 1. Note that in the description below, a known semiconductor manufacturing technique, Patent Document 1, and Patent Document 2 can be referred to.

Figure 8A:
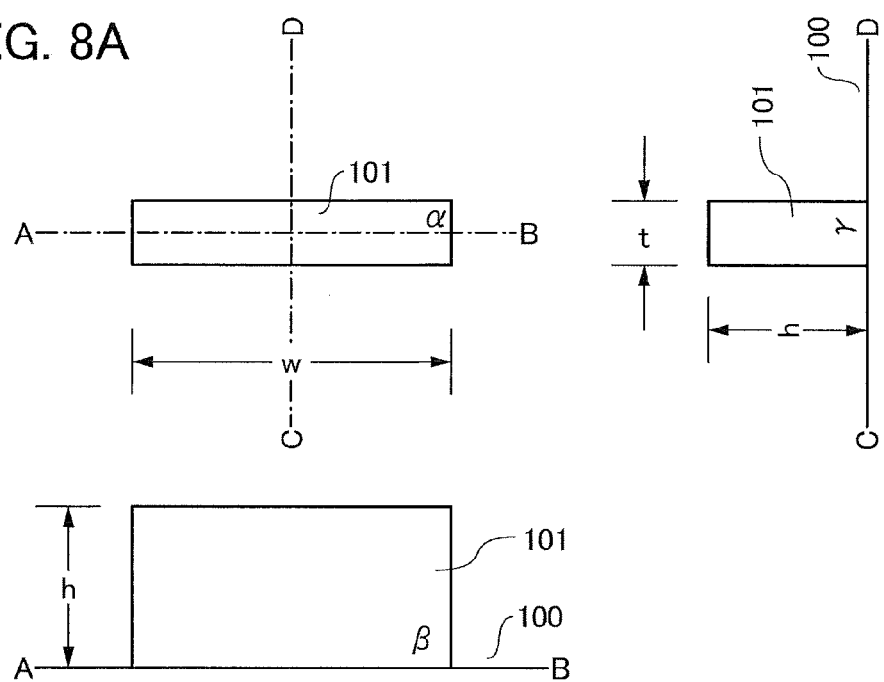
FIGS. 8A and 8B illustrate an example of a method for manufacturing an FET according to an embodiment of the present invention.

First, as illustrated in FIG. 8A, the thin oxide semiconductor 101 is formed over the insulating surface 100. The thickness t of the oxide semiconductor is greater than or equal to 1 nm and less than or equal to 30 nm, preferably greater than or equal to 3 nm and less than or equal to 5 nm. The height h of the oxide semiconductor is greater than or equal to 5 nm and less than or equal to 100 nm, preferably greater than or equal to 10 nm and less than or equal to 50 nm. The width w can be a given value; however, the width w is preferably twice to five times the minimum feature size F in terms of increase of integration degree. The width w is not limited to the above range in the case where a plurality of FETs shares the oxide semiconductor 101.

The oxide semiconductor 101 illustrated in FIG. 8A is a thin rectangular solid having six surfaces. One of the surfaces (i.e., a bottom surface) is included in the insulating surface 100. Another one of the surfaces is not in contact with the insulating surface 100 at all, which is hereinafter referred to as a surface α. Part (a side) of each of the other four surfaces is in contact with the insulating surface 100. The two largest surfaces of the other four surfaces are referred to as surfaces β and the remaining two surfaces are referred to as surfaces γ.

Although the oxide semiconductor 101 in FIG. 8A is a regular rectangular solid, the oxide semiconductor 101 may have another shape. For example, a corner in any of the cross sections of the oxide semiconductor 101 may have a curved surface having a specific curvature radius. In that case, the boundary between the surface α and the surfaces β or the surfaces γ is not clear in some cases. Further, the bottom surface may be larger than the surface α, or the bottom surface may be smaller than the surface α.

Heat treatment may be performed at 250° C. to 750° C. after the formation of the oxide semiconductor 101. This heat treatment is preferably performed in an ultra-dry air having extremely low water vapor concentration (the dew point is lower than or equal to −60° C., preferably lower than or equal to −80° C.) or an atmosphere of a high-purity oxygen gas or a high-purity nitrogen gas (each having the purity of greater than or equal to 6N (the impurity concentration is lower than or equal to 1 ppm), preferably greater than or equal to 7N (the impurity concentration is lower than or equal to 0.1 ppm)), or under a high-vacuum environment of 1 Pa or less.

When the heat treatment is performed in such an atmosphere, hydrogen is released from the oxide semiconductor 101. In particular, hydrogen serves as a donor in an oxide semiconductor having a band gap of greater than or equal to 3 eV and an electron affinity of greater than or equal to 4 eV; therefore, it is preferable to reduce the hydrogen concentration in terms of reducing the off-state current of the FET.

In some cases, a crystal structure in which a c-axis is perpendicular to a surface appears by the heat treatment depending on a material of the oxide semiconductor 101.

Note that when the oxide semiconductor 101 is subjected to heat treatment in a reducing atmosphere such as a high vacuum atmosphere, part of oxygen as well as hydrogen is released. Oxygen vacancies also serve as donors in an oxide semiconductor; therefore, it is preferable to compensate the oxygen vacancies. In order to compensate the oxygen vacancies, heat treatment in an oxidizing atmosphere is preferably performed following the heat treatment in a reducing atmosphere.

The oxide semiconductor 101 may contain nickel or copper which has a property of absorbing electrons at 0.1 atomic % to 5 atomic % for suppression of an increase of carrier (electron, in this case) concentration due to the oxygen vacancies.

Next, the gate insulating film 102 is formed to cover the oxide semiconductor 101. The thickness and the permittivity of the gate insulating film 102 are important factors in determining the characteristics of the transistor. The thickness of the gate insulating film 102 is greater than or equal to 0.5 nm and less than or equal to 20 nm, preferably greater than or equal to 0.5 nm and less than or equal to 10 nm. In the case where an offset region having an appropriate length, such as the one described in Embodiment 2, is provided, the tunneling current can be suppressed; therefore, the physical thickness of the gate insulating film 102 can be less than or equal to 2 nm.

A known material such as silicon oxide, silicon nitride, silicon oxynitride, aluminum oxide, hafnium oxide, lanthanum oxide, zirconium oxide, or tantalum oxide can be used for the gate insulating film 102.

After that, a first conductive material film is formed to cover the gate insulating film 102. A material having a work function of higher than or equal to 5.2 eV (e.g., a platinum-based noble metal such as platinum, osmium, or palladium, indium nitride, indium oxynitride (In—O—N), indium gallium oxynitride (In—Ga—O—N), indium zinc oxynitride (In—Zn—O—N), or indium gallium zinc oxynitride (In—Ga—Zn—O—N)) may be used for a portion of the first conductive material film which is in contact with the gate insulating film 102. The other portion of the first conductive material film may be formed using a material containing a metal material having high conductivity as its main component, such as aluminum, copper, titanium, or tungsten.

Then, a first insulating material film is formed over the first conductive material film. The first insulating material film may be formed using silicon oxide, silicon nitride, silicon oxynitride, aluminum oxide, or the like.

Figure 8B:
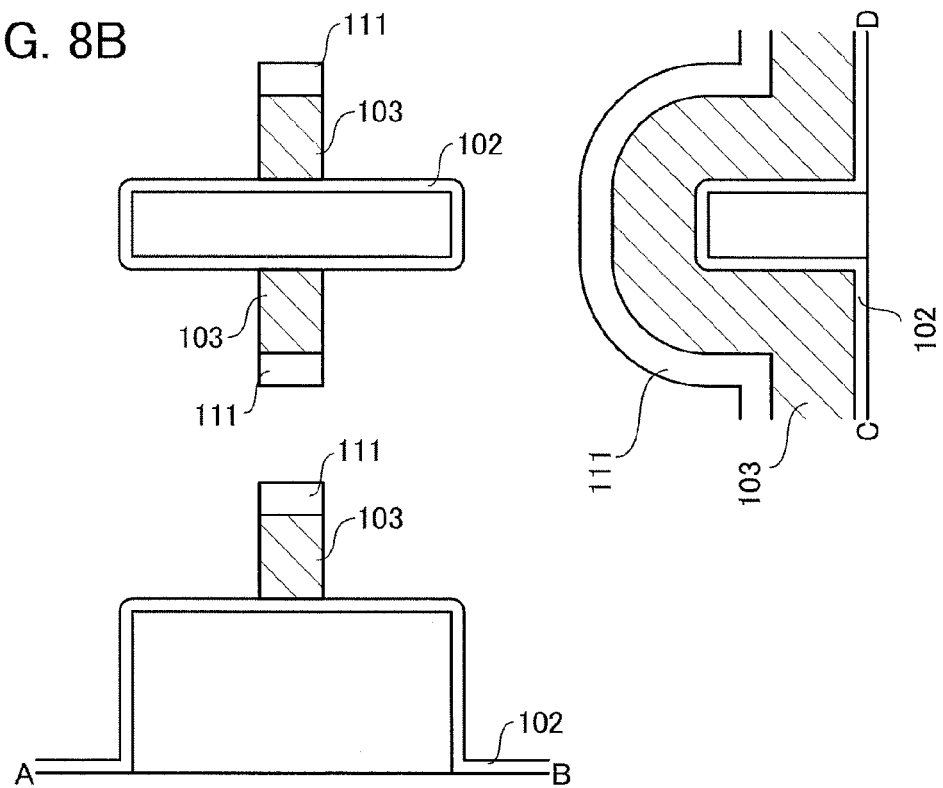

Then, as illustrated in FIG. 8B, the first conductive material film and the first insulating material film are etched to form the strip-like gate 103 which covers part of the surface α and part of the surface β of the oxide semiconductor 101 and a barrier insulator 111 over the gate 103.

After that, phosphorus is injected into the oxide semiconductor 101 by an ion implantation method or the like with the use of the gate 103 and the barrier insulator 111 as masks. Nitrogen or boron may be injected instead of phosphorus. In any case, the oxide semiconductor 101 obtains N-type conductivity. Heat treatment may be performed at 250° C. to 750° C. after injection of ions when necessary. The optimal temperature and the atmosphere in the heat treatment differ depending on the element injected.

In the case where the height h of the oxide semiconductor 101 is greater than 100 nm, ions are not uniformly injected into the oxide semiconductor 101 in some cases; therefore, the height of the oxide semiconductor 101 is preferably less than or equal to 100 nm. In the case where the offset region described in Embodiment 2 is provided, this step of injecting ion is omitted.

After that, a second insulating material film is formed to cover the gate insulating film 102, the gate 103, and the barrier insulator 111. A material of the second insulating material film may be selected from any of the materials of the first insulating material film and a material similar thereto; however, it is preferable that the etching rate of the second insulating material film be different from that of the first insulating material film. Further, it is preferable that the second insulating material film have etching characteristics similar to those of the gate insulating film 102.

Figure 9A:
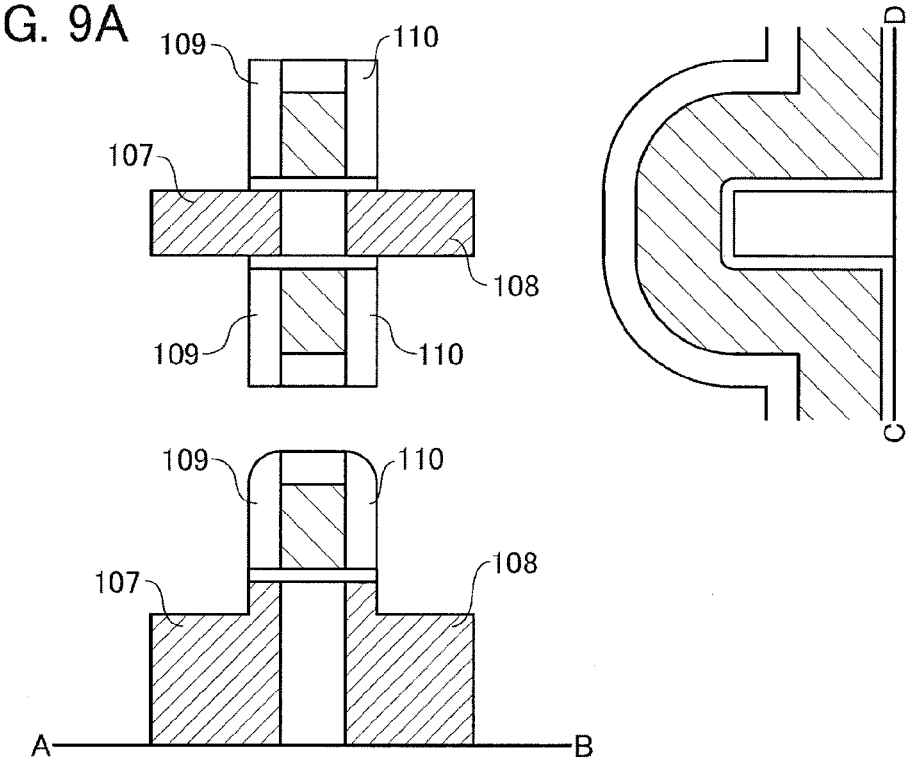
FIGS. 9A and 9B illustrate an example of a method for manufacturing an FET according to an embodiment of the present invention.

After that, as illustrated in FIG. 9A, the sidewall insulator 109 and the sidewall insulator 110 are each formed on side surfaces of the gate 103 and the barrier insulator 111 by an anisotropic etching method. The width of each of the sidewall insulators 109 and 110 is greater than or equal to 5 nm, preferably greater than or equal to 10 nm. At this time, a portion of the gate insulating film 102, which is not covered with the sidewall insulator 109, the sidewall insulator 110, or the gate 103, is also etched to expose the oxide semiconductor 101.

At this time, as illustrated in FIG. 9A, an upper portion of the oxide semiconductor 101 (the N-type region 107 and the N-type region 108) is etched (over-etched) in some cases. This is because the etching selectivity of the second insulating material film with respect to the oxide semiconductor 101 is not high enough.

In particular, in the case where the second insulating material film is formed using silicon oxide or silicon oxynitride, there is little difference between the etching rate of the second insulating material film and that of an oxide semiconductor containing indium or zinc in dry etching; as a result, the oxide semiconductor 101 is etched in any case.

This problem occurs not only in the FET of this embodiment but also in the planar FET illustrated in FIG. 10C. In particular, in the planar FET illustrated in FIG. 10C, the thickness of the oxide semiconductor 201c needs to be extremely small for a sufficient reduction of the off-state current, as described above. In this case, the allowable range of etching conditions becomes narrower; as a result, most part of the oxide semiconductor 201c, which is not covered with the sidewall insulators or the gate 203c, is removed in some cases when the etching conditions deviate from the allowable range.

On the other hand, in the FET of this embodiment, for example, the height of the oxide semiconductor 101 can be sufficiently increased; therefore, even when the oxide semiconductor 101 is etched to some degree, the FET can be manufactured without fail.

In general, etching rate may differ depending on portions in a surface having a certain area. In the planar FET illustrated in FIG. 10C, it is extremely difficult to sufficiently reduce over-etching of the oxide semiconductor 201c in the thickness direction over the whole surface, which becomes a large factor of a decrease in yield.

In the FET of this embodiment, over-etching of the oxide semiconductor 101 not in the thickness t direction but in the height h direction is preferably sufficiently reduced. Since the height h is several or more times the thickness t, the allowable range of the etching conditions is wider, which leads to higher yield.

Figure 9B:
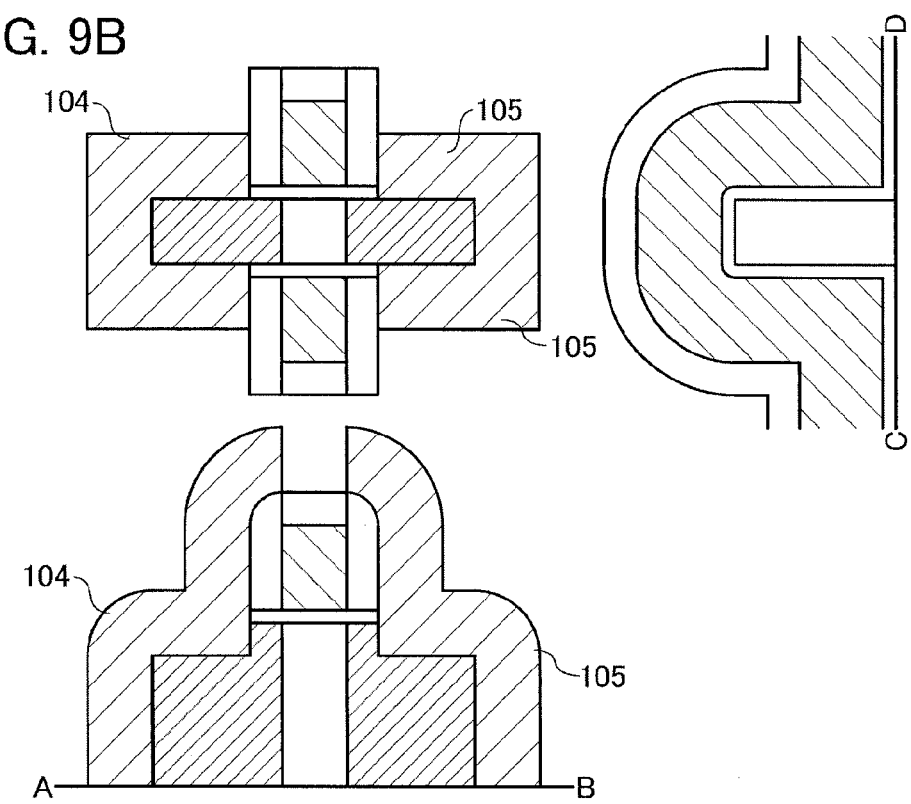

Next, a second conductive material film is formed and then is subjected to etching to form the source 104 and the drain 105 as illustrated in FIG. 9B. The source 104 and the drain 105 are formed in contact with the exposed portions of the oxide semiconductor 101. In FIG. 9B, the source 104 and the drain 105 are formed in contact with the surface α, the surfaces β, and the surfaces γ of the oxide semiconductor 101; however, the source 104 and the drain 105 are not necessarily in contact with the surfaces γ.

Since the oxide semiconductor 101 absorbs water and degrades when exposed to air, a film of an appropriate insulating material (e.g., silicon nitride, aluminum oxide, or aluminum nitride) having a barrier property may be provided in order to prevent the FET from being in contact with air. Note that in the FET of this embodiment, most part of the oxide semiconductor 101 is covered with the gate 103, the source 104, or the drain 105, so that the FET is more durable than the planar FET.

Embodiment 6

Figure 11:
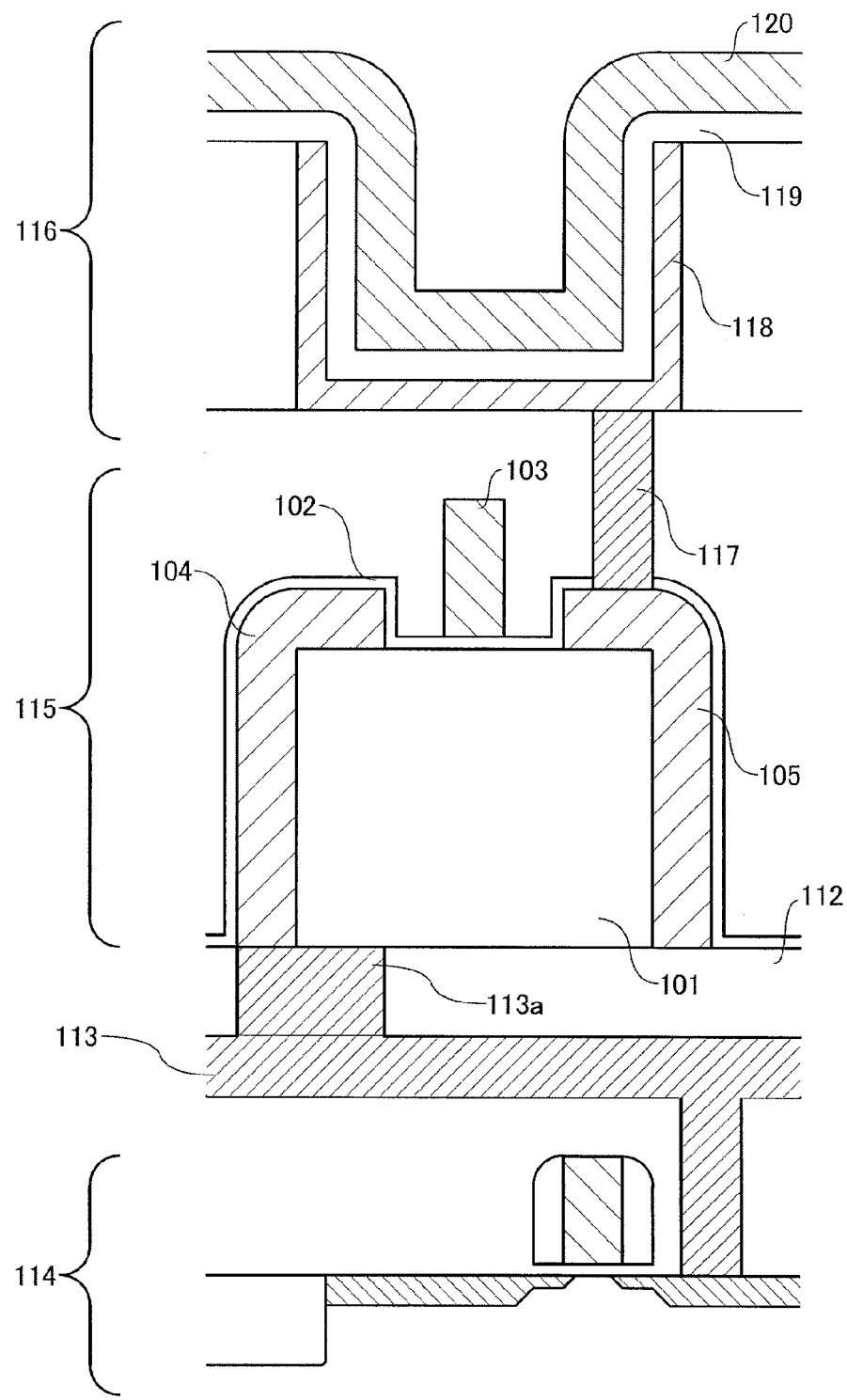
FIG. 11 illustrates an embodiment of the present invention.

Although in the above embodiments, examples in each of which the FET is formed over the insulating surface are described, an FET may be formed over a surface part of which is conductive. In that case, the FET can be electrically connected to a lower layer. FIG. 11 is an example of such an FET and a semiconductor circuit (memory cell) utilizing the FET.

FIG. 11 illustrates an example of a structure of a random access memory (RAM) including one transistor and one capacitor. A circuit having the same configuration with an FET including a silicon semiconductor is referred to as a 1T1C DRAM. This is because data needs to be rewritten (refreshed) every several tens of milliseconds in the FET including a silicon semiconductor due to its large off-state current.

However, as described above, the off-state current of an FET including an oxide semiconductor can be sufficiently smaller than that of the FET including a silicon semiconductor; accordingly, a refresh operation is practically unnecessary in some cases. It is not appropriate to refer a semiconductor circuit including the FET including an oxide semiconductor "DRAM"; therefore, hereinafter, such a semiconductor circuit is referred to simply as "RAM" or "1T1C RAM" in order to distinguish the circuit from a RAM having another structure.

Structures of a memory cell and another circuit which are included in a RAM illustrated in FIG. 11 will be described. The semiconductor circuit illustrated in FIG. 11 includes a driver circuit portion 114 which is formed over a surface of a silicon semiconductor substrate and includes a transistor using a single crystal silicon semiconductor, a cell transistor 115 of the memory cell, a capacitor 116 of the memory cell, and a bit line 113 provided between the memory cell and the driver circuit portion. The bit line 113 can be formed using any of a variety of conductive materials. The bit line 113 is electrically connected to the drive circuit portion 114.

The FET including an offset region, which is described in Embodiment 2, is used as the cell transistor of the memory cell. Embodiment 5 can also be referred to for the manufacturing method and the detailed structure of the FET. Here, a cross-sectional view corresponding to the cross-sectional view of FIG. 5B is shown. Embodiment 2 may be referred to for a cross-sectional view of another plane. Note that without limitation to the FET described in Embodiment 2, any of the FETs described in the other embodiments may also be used.

The FET is formed over an interlayer insulator 112 and a conductive region 113*a* which is electrically connected to the bit line 113, and includes the oxide semiconductor 101, the gate insulating film 102, the gate 103, the source 104, and the drain 105. Part of the oxide semiconductor 101 and part of the source 104 are in contact with the conductive region 113*a*. A surface of the conductive region 113*a* is preferably flat. The drain 105 is not in contact with the conductive region 113*a*. The drain 105 is connected to the capacitor 116 through a connection electrode 117.

The capacitor 116 includes a lower electrode 118, a capacitor insulating film 119, and an upper electrode 120. Note that the structure of the capacitor is not limited thereto, and a variety of structures of known stacked capacitors can be used. The materials, the thicknesses, the sizes, and the like of the variety of known stacked capacitors can be applied to the lower electrode 118, the capacitor insulating film 119, and the upper electrode 120.

Embodiment 7

In this embodiment, an example in which the FET of Embodiment 2 is used in a so-called gain cell memory will be described. Without limitation to the FET of Embodiment 2, any of the FETs of Embodiment 1 and Embodiments 3 to 5 may be used.

A gain cell memory is, for example, the memory disclosed in Patent Document 3, and typically includes two transistors (a writing transistor and a reading transistor) and one capacitor. In addition, a gain cell memory including three transistors, a gain cell memory including one transistor, one diode, and one capacitor, and the like are given.

Figure 12A:
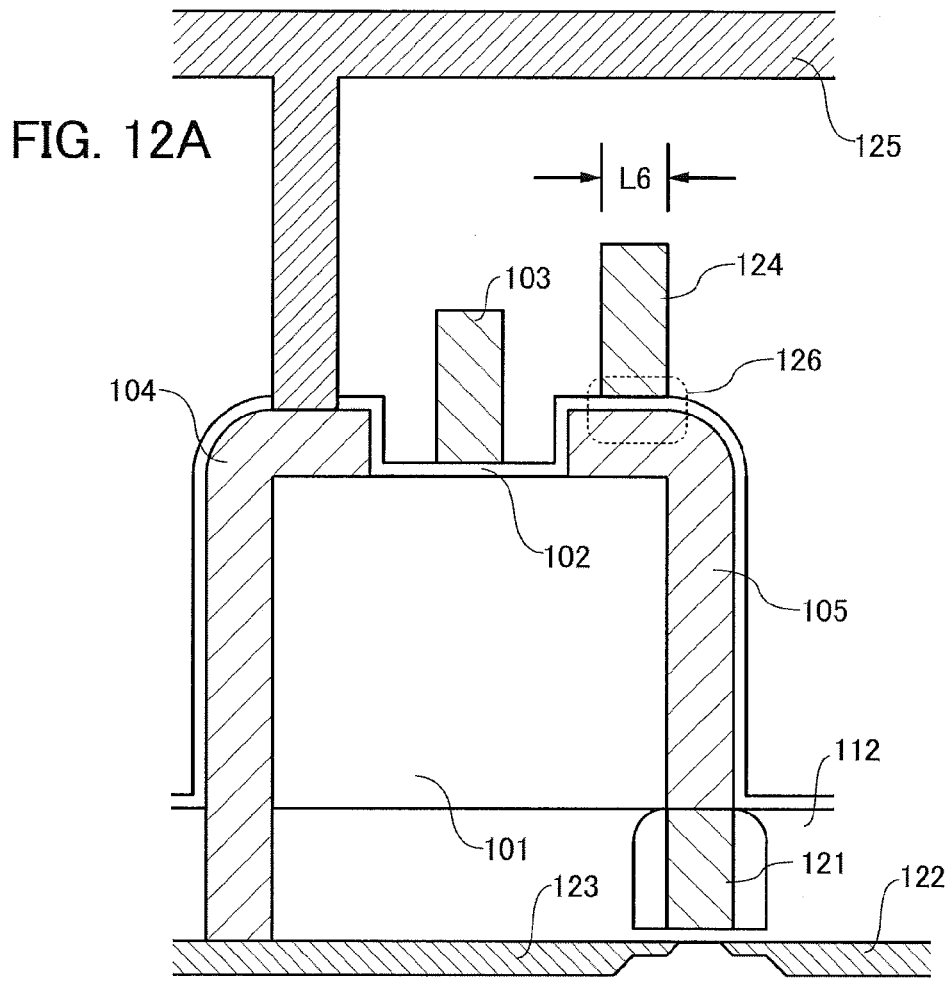
FIGS. 12A and 12B illustrate an embodiment of the present invention.
Figure 12B:
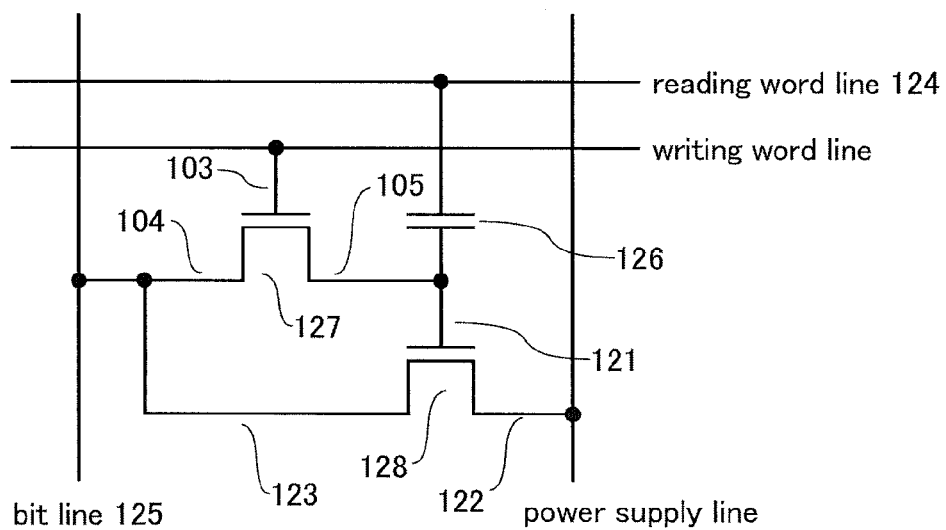

FIG. 12B is a circuit diagram of a memory cell including two transistors and one capacitor. In other words, a gate of a writing transistor 127 is connected to a writing word line; one electrode of a capacitor 126 is connected to a reading word line; a source of the writing transistor 127 and a source of a reading transistor 128 are connected to a bit line; a drain of the writing transistor 127 and the other electrode of the capacitor 126 are connected to a gate of the reading transistor 128; and a drain of the reading transistor 128 is connected to a power supply line.

A gain cell memory including an FET including a silicon semiconductor is generally referred to as a gain cell DRAM because frequent refreshing is necessary.

A gain cell memory has been developed because the capacitance of the capacitor 126 therein can be sufficiently small as compared to that in a DRAM. That is, in a gain cell memory, the necessary capacitance of the capacitor is determined relative to the gate capacitance of the reading transistor 128, whereas in a DRAM, the necessary capacitance of the capacitor is determined relative to the parasitic capacitance of a bit line.

When the capacitance of the capacitor 126 can be made small, time required for charging and discharging of the capacitor, i.e., a switching period can be short. In the DRAM, charging and discharging of the capacitor is a rate-limiting factor which leads to limitation on operation speed. On the other hand, in the gain cell memory, as the design rule is reduced, the gate capacitance of the reading transistor 128 and the capacitance of the capacitor 126 are reduced in the same proportion; thus, a memory capable of extremely fast response can be manufactured.

Specifically, when the design rule is reduced to one tenth (i.e., when each of the length, the width, and the height of the FET is reduced to one tenth), the capacitance of the capacitor 126 is reduced to one tenth and on-state resistance of the FET is also reduced to one tenth; as a result, time required for switching is shortened to one hundredth. However, since the capacitance of the capacitor of the DRAM is not changed even when the on-state resistance of the FET is reduced to one tenth, a switching time is reduced to only one tenth. In other words, the operation speed of the gain cell memory can be ten times as high as that of the DRAM.

As described above, a gain cell memory is expected to have excellent characteristics; however, a gain cell memory has not been put into practical use because off-state current of the FET has not been sufficiently suppressed yet. In general, even when the design rule is reduced to one tenth, off-state current of an FET cannot be reduced to one tenth and leakage current may rather be increased due to a variety of other factors.

For instance, in an FET in which a PN junction is used for insulation between a source and a drain in an off state, as the FET is miniaturized, leakage current due to tunneling current between bands at the PN junction is increased. Besides, in the case of a semiconductor with a small band gap (less than 1.5 eV), an adverse effect of thermally excited carriers is also considerable. If off-state current cannot be suppressed, there is still difficulty in reducing the capacitance of the capacitor.

In the case of forming a known FET using a silicon semiconductor as the writing transistor 127 of the gain cell memory, an advantage produced by using two transistors cannot be gained. For example, if the capacitance of the capacitor 126 is approximately 10 fF similarly to a general DRAM, leakage current in the FET using a silicon semiconductor in an off state is approximately $10^{-14}$ A at the lowest; therefore, charge stored in the capacitor 126 is lost in one second or so. Thus, a refreshing operation needs to be performed more than 10 times per second similarly to a general DRAM.

The capacitance of the capacitor in a gain cell memory needs to be reduced because cost cannot be offset when a capacitor having the same capacitance is used in the gain cell memory in which one more transistor is provided than in a DRAM. When the capacitance of the capacitor in a DRAM is reduced, an error in reading data is caused due to relative ratio of the capacitance of the capacitor to the parasitic capacitance of the bit line, while data can be read in a gain cell memory even when the capacitance of the capacitor is reduced to one tenth.

However, since the off-state current of an FET including a silicon semiconductor is relatively large, when the capacitance of the capacitor is reduced to one tenth, an interval between refresh operations is also reduced to one tenth. Thus, power consumption is increased and access to a memory is limited. Similarly, when the capacitance of the capacitor is reduced to one hundredth, the interval between refresh operations is reduced to one hundredth, in which case the gain cell memory is not practical at all. Conventionally, there is no way to sufficiently reduce leakage current of the writing transistor 127, and thus, such a gain cell has not been put to practical use.

When an FET including an oxide semiconductor in a channel is used as the writing transistor 127, the off-state current thereof is extremely small. A gain cell memory can be an extremely promising memory cell when off-state current is sufficiently small. In other words, since the capacitance of the capacitor 126 can be made as small as the gate capacitance of the writing transistor 127 or the reading transistor 128, a capacitor in a special shape (a stacked capacitor or a trench capacitor) which is used in a DRAM need not to be provided, whereby the degree of freedom for design is increased and the process becomes simpler. In addition, a memory capable of high speed operation as described above can be manufactured.

For example, when off-state current is one millionth (approximately $10^{-20}$ A) of that in a silicon transistor, an interval between refresh operations can be one thousand times as long as that in a DRAM (i.e., an refresh operation is performed once per minute) even when the capacitance of the capacitor is one thousandth of that in a DRAM. When off-state current is smaller, for example, $10^{-24}$ A or smaller, a refresh operation needs to be performed only once every few days.

Writing in such a gain cell memory means charging of a capacitor having much smaller capacitance than that in a DRAM as described above; therefore, even when the characteristics of the writing transistor 127 are not so excellent, writing can be performed as fast as that performed in an existing DRAM. For example, in the case where the capacitance of the capacitor 126 is one thousandth of that of a capacitor of a DRAM, on-state current (or mobility) in the writing transistor 127 may be one thousandth of that in a transistor of the DRAM.

Even if the mobility of the writing transistor 127 is one hundredth of that of a transistor using a silicon semiconductor, writing can be performed at a speed 10 times as high as in an ordinary DRAM. As described above, higher speed can be realized as the design rule is decreased.

When the off-state current of the writing transistor 127 is made sufficiently small and a refresh operation is practically unnecessary, an aspect of the gain cell memory as a nonvolatile memory is strengthened. When a refresh operation is unnecessary, in addition to usage of the gain cell memory as a RAM, the gain cell memory can be applied to a memory having a NAND structure. Integration degree of the gain cell memory can be further increased by the NAND structure.

FIG. 12A is an overview of the gain cell memory of this embodiment. The reading transistor 128 includes a gate 121, a source 123, and a drain 122. The drain 122 functions as a power supply line or is connected to the power supply line, and is preferably extended in a word line direction. Further, the source 123 is connected to the source 104 of the writing transistor 127.

The FET described in Embodiment 2 is used as the writing transistor 127. However, without limitation thereto, any of the FETs of Embodiment 1 and Embodiments 3 to 5 may be used. FIG. 12A corresponds to FIG. 5B.

The writing transistor 127 includes, over the interlayer insulator 112, the oxide semiconductor 101, the gate insulating film 102, the gate 103, the source 104, and the drain 105. The drain 105 is in contact with the gate 121 of the reading transistor 128. Note that the gate 103 functions as the writing word line or part thereof. It is preferable that the gate 121 of the reading transistor 128 be electrically connected to the drain 105 of the writing transistor 127, and be not electrically connected to the gate 103 and the source 104 of the writing transistor 127.

Further, the bit line is connected to the source 104. A reading word line 124 is provided to overlap with the drain 105 with the gate insulating film 102 provided therebetween. The reading word line 124, the drain 105 and the gate insulating film 102 form the capacitor 126. Similarly to the gate 103, the reading word line 124 covers a side surface of the oxide semiconductor 101 with the drain 105 provided therebetween.

Therefore, when the width of the reading word line 124 is L6, the area of the capacitor 126 (the area of a portion where the reading word line 124 overlaps with the drain 105) is larger than (2 h+t)×L6. On the other hand, the gate area of the gate 121 of the reading transistor 128 is approximately L6×L6. Since the height h of the oxide semiconductor can be increased regardless of the minimum feature size of a circuit, the capacitance of the capacitor 126 can be twice or more times the gate capacitance of the reading transistor 128. This means that an error is less likely to be caused in data reading.

The memory cell having the structure illustrated in FIG. 12A may be manufactured as follows. First, with the use of a single crystal silicon semiconductor, the gate 121, the source 123, and the drain 122 of the reading transistor 128 are manufactured, and the interlayer insulator 112 is formed thereover. Then, a surface of the interlayer insulator 112 is planarized, so that the gate 121 is exposed.

After that, the thin oxide semiconductor 101 is formed, and a contact hole reaching the source 123 of the reading transistor 128 is formed in the interlayer insulator 112. Then, the source 104 and the drain 105 are formed to cover part of the oxide semiconductor 101. The drain 105 is in contact with the gate 121 of the reading transistor 128 and the source 104 is in contact with the source 123 of the reading transistor 128.

Then, the gate insulating film 102 is formed. Further, the gate 103 and the reading word line 124 are formed to cover the gate insulating film 102. After that, a contact hole reaching the source 104 is provided, and a bit line 125 is formed.

Unlike a DRAM, the gain cell memory of this embodiment does not need a step of amplifying a signal in data reading and a circuit for the step; therefore, the gain cell memory can be used as a register (a memory device for storing data temporarily) of a variety of semiconductor circuits.

A register in a semiconductor circuit is generally formed using a flip-flop circuit including six transistors, and thus, an area occupied by the register is large. In contrast, the gain cell memory of this embodiment only includes two transistors and one capacitor, and the two transistors are provided three-dimensionally; thus, the area occupied by the gain cell memory is smaller than that by the conventional register.

Moreover, data is erased in the register including a flip-flop circuit when the power supply to the register is stopped, and the flip-flop circuit cannot return to the same state even after the power supply is restarted. In contrast, data can be held for a certain period in the gain cell memory of this embodiment even when the power supply to the gain cell memory is stopped; thus, the gain cell memory can quickly return to the same state after the power supply is restarted.

With such characteristics, power consumption can be reduced in such a manner that power supply is stopped even for a short time when an operation is not performed as a semiconductor circuit and power supply is restarted when an operation is required. For example, in a circuit for processing and outputting an image, image data is processed and output every 17 milliseconds. The time required for the operation is shorter than or equal to 1 millisecond, and the circuit can be turned off during remaining 16 milliseconds or longer. Thus, power consumption of the circuit can be reduced.

In a CPU which is a larger semiconductor circuit, each of a plurality of circuits performs an operation, but not all the circuits perform operations all the time and many of the circuits just wait. When power is not supplied to such waiting circuits, power consumption can be greatly reduced. When the gain cell memory of this embodiment is used as a register in such circuits, supply and stop of power to the circuits can be performed instantly.

Embodiment 8

Figure 14:
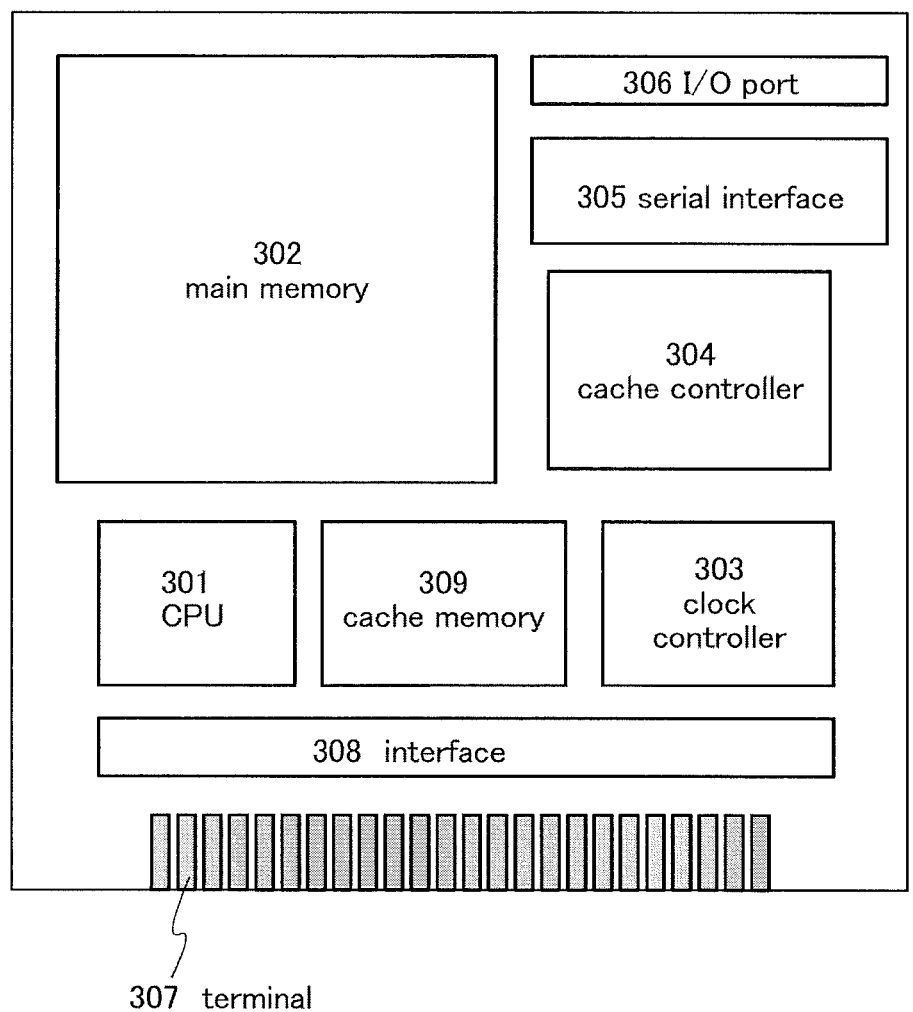
FIG. 14 illustrates an application example of an embodiment of the present invention.

Hereinafter, an application example of the memory of Embodiment 6 or Embodiment 7 will be described with reference to FIG. 14. FIG. 14 is a block diagram showing a structure example of a microprocessor. The microprocessor illustrated in FIG. 14 includes a CPU 301, a main memory 302, a clock controller 303, a cache controller 304, a serial interface 305, an I/O port 306, terminals 307, an interface 308, a cache memory 309, and the like. It is needless to say that the microprocessor illustrated in FIG. 14 is just an example of the simplified structure, and practical microprocessors have various structures depending on their usages.

In order to operate the CPU 301 at high speed, a high-speed memory matched for the speed of the CPU 301 is needed. However, a high-speed large capacity memory whose access time is matched for the operation speed of the CPU 301 generally costs high. Thus, in addition to the main memory 302 having large capacity, the cache memory 309 which is a high-speed memory having smaller capacity than the main memory 302, such as an SRAM, is provided between the CPU 301 and the main memory 302. The CPU 301 accesses the cache memory 309, thereby operating at high speed regardless of the speed of the main memory 302.

In the microprocessor illustrated in FIG. 14, the above-described memory can be used for the main memory 302. According to the above structure, a highly integrated, highly reliable microprocessor can be provided.

A program to be executed in the CPU 301 is stored in the main memory 302. The program stored in the main memory 302 is downloaded to the cache memory 309 in the initial execution, for example. Not only the program stored in the main memory 302 but also a program in any external memory can be downloaded. The cache memory 309 not only stores the program executed in the CPU 301 but also functions as a work region and temporarily stores the calculation results or the like of the CPU 301.

The number of CPUs is not limited to one; a plurality of CPUs may be provided. By processing in parallel with a plurality of CPUs, the operation speed can be improved. In that case, if the processing speeds of the CPUs are uneven, malfunction may occur in some cases as a whole processing; hence, the processing speed of each CPU which is a slave may be balanced by the rest of the CPUs which is/are a master/masters.

Although the microprocessor is given as an example herein, the usage of the above-described memory is not limited to the main memory of the microprocessor. For example, the above-described memory is also preferably used as a video RAM which is used in a driver circuit of a display device or a large capacity memory which is involved in an image processing circuit. Besides, also in a variety of system LSIs, the above-described memory can be used as a large capacity memory or a small-sized memory.

Embodiment 9

In this embodiment, examples of a semiconductor device including the memory of Embodiment 6 or Embodiment 7 will be described. The memory according to an embodiment of the present invention leads to a reduction in the size of the semiconductor device. In particular, in the case of a portable semiconductor device, an advantage in improving convenience of users can be provided through reduction in size with the memory according to an embodiment of the present invention.

The memory according to an embodiment of the present invention can be used for display devices, notebook personal computers, or image reproducing devices provided with recording media (typically, devices which reproduce the content of recording media such as digital versatile discs (DVDs) and have displays for displaying the reproduced images).

Figure 15A:
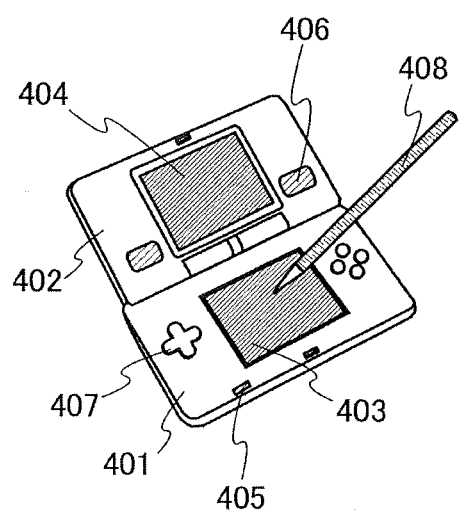
FIGS. 15A to 15C each illustrate an application example of an embodiment of the present invention.
Figure 15B:
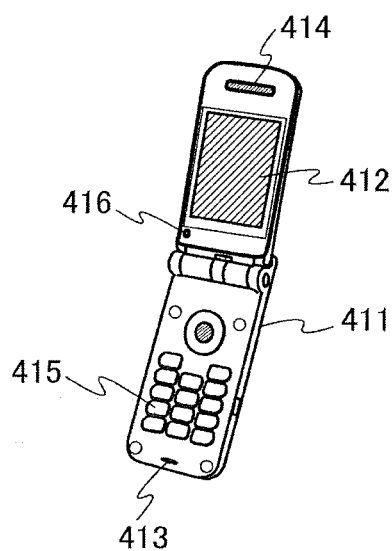
Figure 15C:
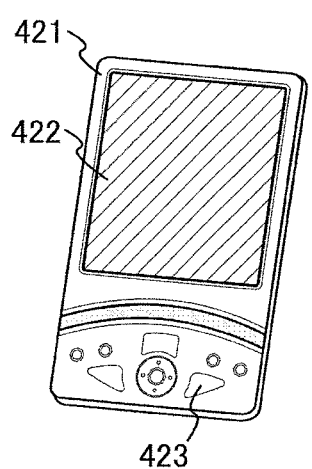

Other than the above, as examples of the semiconductor device to which the memory according to an embodiment of the present invention can be applied, mobile phones, portable game machines, portable information terminals, e-book readers, cameras such as video cameras or digital still cameras, goggle-type displays (head mounted displays), navigation systems, audio reproducing devices (e.g., car audio systems and digital audio players), copiers, facsimiles, printers, multifunction printers, automated teller machines (ATMs), vending machines, and the like can be given. FIGS. 15A to 15C illustrate concrete examples of the semiconductor devices.

FIG. 15A illustrates a portable game machine including a housing 401, a housing 402, a display portion 403, a display portion 404, a microphone 405, speakers 406, an operation key 407, a stylus 408, and the like. The memory according to an embodiment of the present invention can be applied to an integrated circuit for controlling driving of the portable game machine. With the use of the memory according to an embodiment of the present invention for the integrated circuit for controlling driving of the portable game machine, a compact portable game machine can be provided. Although the portable game machine illustrated in FIG. 15A has two display portions, 403 and 404, the number of display portions included in the portable game machine is not limited to two.

FIG. 15B illustrates a mobile phone including a housing 411, a display portion 412, an audio-input portion 413, an audio-output portion 414, operation keys 415, a light-receiving portion 416, and the like. Light received in the light-receiving portion 416 is converted into electrical signals, whereby external images can be loaded. The memory according to an embodiment of the present invention can be applied to an integrated circuit for controlling driving of the mobile phone. With the use of the memory according to an embodiment of the present invention for the integrated circuit for controlling driving of the mobile phone, a compact mobile phone can be provided.

FIG. 15C illustrates a portable information terminal including a housing 421, a display portion 422, operation keys 423, and the like. In the portable information terminal illustrated in FIG. 15C, a modem may be incorporated in the housing 421. The memory according to an embodiment of the present invention can be applied to an integrated circuit for controlling driving of the portable information terminal. With the use of the memory according to an embodiment of the present invention for the integrated circuit for controlling driving of the portable information terminal, a compact portable information terminal can be provided.

This application is based on Japanese Patent Application serial no. 2011-067213 filed with Japan Patent Office on Mar. 25, 2011, the entire contents of which are hereby incorporated by reference.

What is claimed is:

1. A semiconductor device comprising a transistor, the transistor comprising:
   an oxide semiconductor over a substrate, the oxide semiconductor including a bottom surface, a top surface and side surfaces, the side surfaces extending in a channel length direction of the transistor, wherein a height of the oxide semiconductor is greater than a length of the oxide semiconductor at the bottom surface along a direction perpendicular to the channel length direction;
   a source electrode in contact with at least the top surface of the oxide semiconductor;
   a drain electrode in contact with at least the top surface of the oxide semiconductor; and
   a gate electrode along the top surface and the side surfaces with a gate insulating film between the gate electrode and the oxide semiconductor,
   wherein the gate electrode partly overlaps the source electrode, and
   wherein the gate electrode partly overlaps the drain electrode.

2. The semiconductor device according to claim 1, wherein the oxide semiconductor comprises any one of indium oxide, zinc oxide, tin oxide, an In—Zn-based oxide, a Sn—Zn-based oxide, an Al—Zn-based oxide, a Zn—Mg-based oxide, a Sn—Mg-based oxide, an In—Mg-based oxide, an In—Sn-based oxide, an In—Ga-based oxide, an In—Ga—Zn-based oxide, an In—Sn—Zn-based oxide, an In—Al—Zn-based oxide, a Sn—Ga—Zn-based oxide, an Al—Ga—Zn-based oxide, a Sn—Al—Zn-based oxide, and an In—Sn—Ga—Zn-based oxide.

3. A random access memory comprising the transistor according to claim 1 as a cell transistor.

4. A memory comprising the transistor according to claim 1 as a writing transistor.

5. The semiconductor device according to claim 1, wherein a corner portion of the oxide semiconductor has a curved shape.

6. The semiconductor device according to claim 1, wherein the oxide semiconductor has crystallinity.

7. The semiconductor device according to claim 1, wherein part of the oxide semiconductor comprises an N-type region comprising nitrogen, boron, or phosphorus.

8. The semiconductor device according to claim 1,
   wherein the oxide semiconductor comprises a first region including crystals, and
   wherein c-axes of the crystals in the first region are substantially perpendicular to a surface of the oxide semiconductor.

9. The semiconductor device according to claim 8,
   wherein the first region is in contact with the top surface of the oxide semiconductor,
   wherein the oxide semiconductor comprises a second region being in contact with one of the side surfaces of the oxide semiconductor,
   wherein the second region includes crystals, and
   wherein c-axes of the crystals in the second region are substantially perpendicular to the one of the side surfaces of the oxide semiconductor.

10. A semiconductor device comprising a transistor, the transistor comprising:
    an oxide semiconductor over a substrate, the oxide semiconductor including a bottom surface, a top surface and side surfaces, the side surfaces extending in a channel length direction of the transistor, wherein a height of the oxide semiconductor is greater than a length of the oxide semiconductor at the bottom surface along a direction perpendicular to the channel length direction;
    a source electrode in contact with at least the top surface of the oxide semiconductor;
    a drain electrode in contact with at least the top surface of the oxide semiconductor; and
    a gate electrode along the top surface and the side surfaces with a gate insulating film between the gate electrode and the oxide semiconductor,
    wherein the source electrode is in contact with the side surfaces of the oxide semiconductor,
    wherein the drain electrode is in contact with the side surfaces of the oxide semiconductor,
    wherein the gate electrode partly overlaps the source electrode, and
    wherein the gate electrode partly overlaps the drain electrode.

11. The semiconductor device according to claim 10, wherein the oxide semiconductor comprises any one of indium oxide, zinc oxide, tin oxide, an In—Zn-based oxide, a Sn—Zn-based oxide, an Al—Zn-based oxide, a Zn—Mg-based oxide, a Sn—Mg-based oxide, an In—Mg-based oxide, an In—Sn-based oxide, an In—Ga-based oxide, an In—Ga—Zn-based oxide, an In—Sn—Zn-based oxide, an In—Al—Zn-based oxide, a Sn—Ga—Zn-based oxide, an Al—Ga—Zn-based oxide, a Sn—Al—Zn-based oxide, and an In—Sn—Ga—Zn-based oxide.

12. A random access memory comprising the transistor according to claim 10 as a cell transistor.

13. A memory comprising the transistor according to claim 10 as a writing transistor.

14. The semiconductor device according to claim 10, wherein a corner portion of the oxide semiconductor has a curved shape.

15. The semiconductor device according to claim 10, wherein the oxide semiconductor has crystallinity.

16. The semiconductor device according to claim 10, wherein part of the oxide semiconductor comprises an N-type region comprising nitrogen, boron, or phosphorus.

17. The semiconductor device according to claim 10,
wherein the oxide semiconductor comprises a first region including crystals, and
wherein c-axes of the crystals in the first region are substantially perpendicular to a surface of the oxide semiconductor.

18. The semiconductor device according to claim 17,
wherein the first region is in contact with the top surface of the oxide semiconductor,
wherein the oxide semiconductor comprises a second region being in contact with one of the side surfaces of the oxide semiconductor,
wherein the second region includes crystals, and
wherein c-axes of the crystals in the second region are substantially perpendicular to the one of the side surfaces of the oxide semiconductor.

* * * * *